(12) United States Patent  (10) Patent No.: US 8,913,226 B2
Demarest  (45) Date of Patent: Dec. 16, 2014

(54) CYCLIC ERROR COMPENSATION IN INTERFEROMETRIC ENCODER SYSTEMS

(75) Inventor: Frank C. Demarest, Higganum, CT (US)

(73) Assignee: Zygo Corpporation, Middlefield, CT (US)

( * ) Notice: Subject to any disclaimer, the term of this patent is extended or adjusted under 35 U.S.C. 154(b) by 281 days.

(21) Appl. No.: 13/315,957

(22) Filed: Dec. 9, 2011

(65) Prior Publication Data

US 2012/0154780 A1 Jun. 21, 2012

Related U.S. Application Data

(60) Provisional application No. 61/443,108, filed on Feb. 15, 2011, provisional application No. 61/423,735, filed on Dec. 16, 2010.

(51) Int. Cl.
G03B 27/42 (2006.01)
G01D 5/244 (2006.01)
G01D 5/38 (2006.01)
G03F 7/20 (2006.01)

(52) U.S. Cl.
CPC .............. *G01D 5/24476* (2013.01); *G01D 5/38* (2013.01); *G03F 7/70775* (2013.01)
USPC .................................. 355/53; 355/72; 355/77

(58) Field of Classification Search
CPC . G01D 5/24428; G01D 5/38; G01B 9/02007; G01B 9/0207
USPC .......................................... 355/30, 53, 72, 77
See application file for complete search history.

(56) References Cited

U.S. PATENT DOCUMENTS

| 5,483,343 | A | 1/1996 | Iwamoto et al. |
| 5,767,972 | A | 6/1998 | Demarest |
| 5,818,588 | A | 10/1998 | Matsumoto et al. |
| 6,597,459 | B2 | 7/2003 | Demarest |
| 6,950,192 | B2 | 9/2005 | Hill |
| 6,975,406 | B2 | 12/2005 | Demarest |
| 7,426,037 | B2 | 9/2008 | Ostrovsky et al. |

(Continued)

FOREIGN PATENT DOCUMENTS

| JP | 08-005314 | 1/1996 | ............... G01B 9/02 |
| JP | 2008-510170 | 4/2008 | ............... G01B 9/02 |

OTHER PUBLICATIONS

International Search Report and Written Opinion mailed on Jul. 9, 2012 in corresponding International Application No. PCT/US2011/064167.

(Continued)

*Primary Examiner* — Mesfin T Asfaw
(74) *Attorney, Agent, or Firm* — Fish & Richardson P.C.

(57) ABSTRACT

Methods and apparatuses for performing the same, where the methods include obtaining, from an interferometer, a time-varying interference signal S(t) based on a combination of a first beam and a second beam, the first beam being diffracted from an encoder scale, in which at least one of the encoder scale and the interferometer is moveable with respect to the other, obtaining one or more error correction signals based on one or more errors that modify the time-varying interference signal S(t), and outputting information about a change in a position of the encoder scale relative to the interferometer based on the time-varying interference signal S(t) and the one or more error correction signals.

59 Claims, 10 Drawing Sheets

(56) References Cited

U.S. PATENT DOCUMENTS

| | | |
|---|---|---|
| 7,428,685 B2 | 9/2008 | Demarest et al. |
| 7,616,322 B2 | 11/2009 | Hill et al. |
| 2003/0007158 A1 | 1/2003 | Hill |
| 2006/0087657 A1 | 4/2006 | Holmes et al. |
| 2007/0008547 A1* | 1/2007 | Hill et al. ................ 356/498 |
| 2007/0058173 A1* | 3/2007 | Holzapfel ................ 356/499 |
| 2007/0146722 A1* | 6/2007 | Trutna et al. ............. 356/487 |
| 2008/0304077 A1 | 12/2008 | Demarest |

OTHER PUBLICATIONS

*An Economical Class of Digital Filters for Decimation and Interpolation*; E. B. Hogenauer; IEEE Transactions on Acoustics, Speech, and Signal Processing; vol. ASSP-29, No. 2, Apr. 1981, p. 155-162.
Taiwan Office Action and English Translation for Taiwan Patent Application No. 100145898 dated Jan. 17, 2014 (10 pages).
Japanese Office Action for Application No. 2013-544625 dated May 10, 2014 (4 pages).

\* cited by examiner

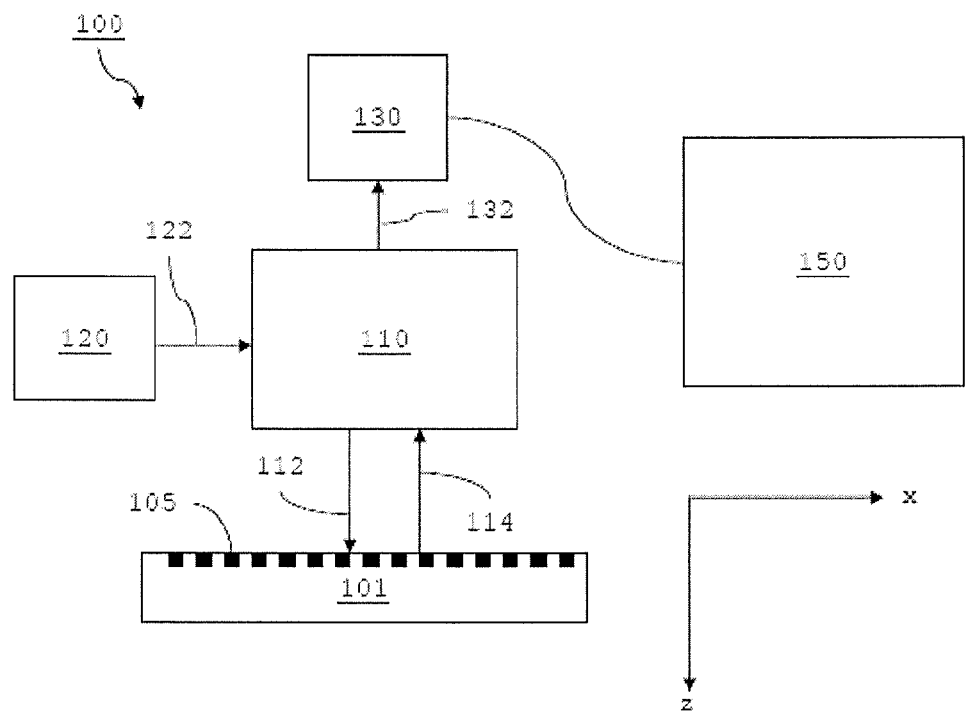
FIG. 1
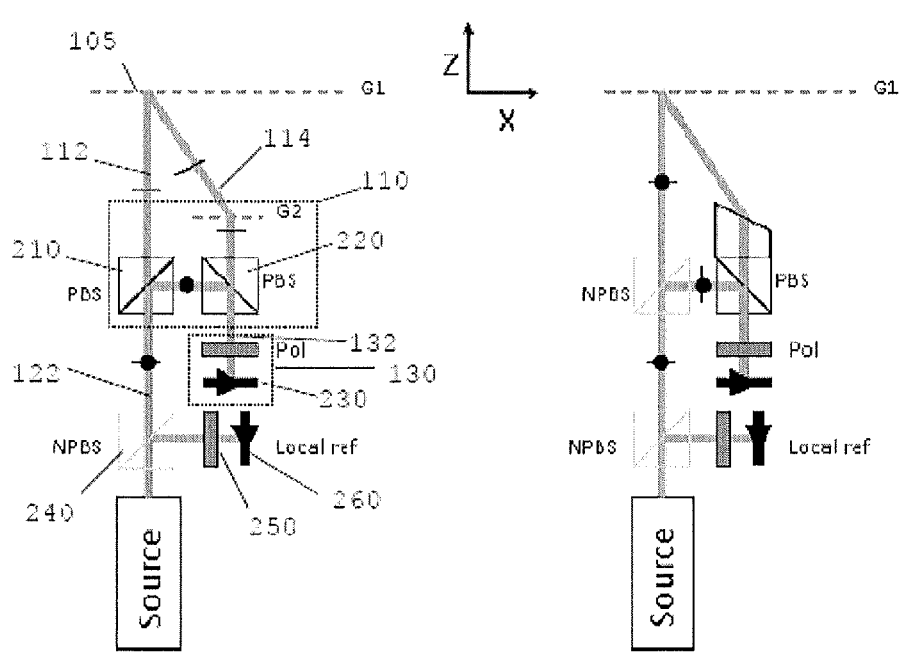 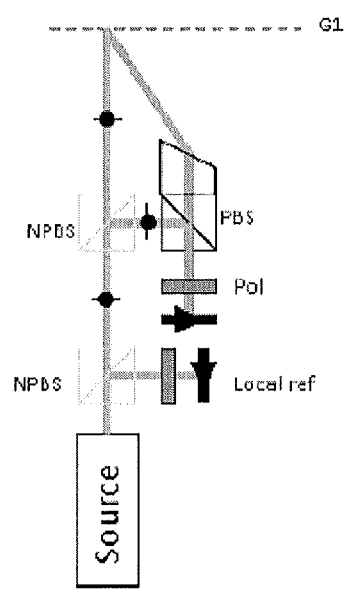
FIG. 2A          FIG. 2B

CYCLIC ERROR COMPENSATION IN INTERFEROMETRIC ENCODER SYSTEMS

CROSS REFERENCE TO RELATED APPLICATIONS

This application claims benefit of provisional patent application No. 61/443,108, entitled "CYCLIC ERROR COMPENSATION IN INTERFEROMETRIC ENCODER SYSTEMS," filed on Feb. 15, 2011, and provisional patent application No. 61/423,735, entitled "CYCLIC ERROR COMPENSATION IN INTERFEROMETRIC ENCODER SYSTEMS," filed on Dec. 16, 2010. The contents of each of these provisional applications are hereby incorporated by reference in their entirety.

BACKGROUND AND TECHNICAL FIELD

In some cases, interferometric measuring systems monitor changes in the relative position of a measurement object based on an optical interference signal. For example, an interferometer generates the optical interference signal by overlapping and interfering a measurement beam reflected from the measurement object with a second beam, sometimes called a "reference beam." Changes in the relative position of the measurement object correspond to changes in the phase of the measured optical interference signal.

However, many interferometric measuring systems include nonlinearities such as what are known as "cyclic errors." The cyclic errors can be expressed as contributions to the phase and/or the intensity of the measured interference signal and have a sinusoidal dependence on the change in an optical path difference between the measurement beam and the second beam. The cyclic errors can be produced by "beam mixing," in which a portion of an input beam that nominally forms the second beam propagates along a measurement path and/or a portion of an input beam intended to propagate along the measurement path instead propagates along a reference path. Such beam mixing can be caused by ellipticity in the polarizations of the input beam and/or imperfections in the interferometer components. Cyclic errors can also be produced by imperfections in components such as retro-reflectors and/or phase retardation plates that produce undesired ellipticities in beams in the interferometer. If not compensated, the foregoing cyclic errors can limit the accuracy of position changes measured by the interferometer system.

SUMMARY

The subject matter of this disclosure relates to cyclic error compensation in interferometric measurement systems, e.g., interferometric encoder systems.

In general, in one aspect, the disclosure features methods that include obtaining, from an interferometer, a time-varying interference signal S(t) based on a combination of a first beam and a second beam, subsequent to the first beam being diffracted from an encoder scale, in which at least one of the encoder scale and the interferometer is moveable with respect to the other, obtaining one or more error correction signals based on one or more errors that modify the time-varying interference signal S(t), and outputting information about a change in a position of the encoder scale relative to the interferometer based on the time-varying interference signal S(t) and the one or more error correction signals.

Implementations of the method can include one or more of the following features and/or features of other aspects. For example, the one or more errors can cause the time-varying interference signal S(t) to deviate from an ideal expression of the form $A_1 \cos(\Phi_R(t)+\Phi(t)+\zeta_1)$, where $A_1$ and $\zeta_1$ are constants, $\Phi_R(t)$ is a time-varying reference phase equal to $\omega_R t$ where $\omega_R$ is an angular frequency difference between the first beam and the second beam, and $\Phi(t)$ is a phase difference indicative of an optical path difference between the first beam and the second beam. The method can further include measuring $\Phi_R(t)$ from a reference beam derived from a first portion of an input beam. In some implementations, the first beam and the second beam can be derived from a second portion of the input beam.

In some implementations, the method further includes applying a frequency transform to the time-varying interference signal S(t) to generate a complex measurement signal. For example, applying the frequency transform can include applying a Discrete Fourier Transform (DFT) to the time-varying interference signal S(t). The DFT can include a window function. The DFT can be folded. In another example, applying the frequency transform to the time-varying interference signal S(t) can include digitizing the time-varying interference signal S(t) to produce a digitized measurement signal. Applying the frequency transform to the time-varying interference signal S(t) can further include converting a series of consecutive samples of the digitized measurement signal into the complex measurement signal. The method can further include compensating the complex measurement signal based on the one or more error correction signals to provide the information about the change in the position of the encoder scale relative to the interferometer. For example, compensating the complex measurement signal can include subtracting the one or more error correction signals from the complex measurement signal. Obtaining one or more error correction signals can include obtaining one or more error basis functions representative of the one or more errors, obtaining one or more factors relating to at least one of amplitude or offset phase of one or more cyclic error terms, and generating the one or more error correction signals based on the one or more error basis functions and the one or more factors. For example, the one or more factors can be complex factors. In another example, obtaining the one or more factors can be based on values from the complex measurement signal.

In some implementations, the one or more error correction signals can include an error correction signal representative of a negative Doppler error.

In some implementations, the one or more error correction signals can include an error correction signal representative of a baseband Doppler error, the baseband Doppler error being independent of the reference phase $\Phi_R(t)$.

In some implementations, the one or more error correction signals include an error correction signal representative of a zero Doppler error.

In some implementations, outputting the information about the change in the position of the encoder scale relative to the interferometer includes reducing contributions from the one or more errors based on the one or more correction signals to produce a corrected time-varying interference signal. For example, outputting the information about the change in the position of the encoder scale relative to the interferometer can further include determining information indicative of an optical path difference between the first beam and the second beam from the corrected time-varying interference signal.

In some implementations, the first beam can be a non-zero diffracted order of a primary beam impinging on the encoder scale, where the first beam is non-co-linear with the primary beam at the encoder scale.

In some implementations, the first beam and the second beam can be derived from a common source. The common source can be configured to introduce an angular frequency difference between the first beam and the second beam.

In some implementations, the first beam and the second beam are orthogonally polarized with respect to one another.

In some implementations, the encoder scale includes a grating. For example, the grating can include a one-dimensional grating. In another example, the grating can include a two-dimensional grating.

In general, in another aspect, the disclosure features an apparatus that includes an interferometry system configured to, during operation of the apparatus, combine a first beam diffracted from an encoder scale and a second beam to produce an output beam corresponding to a time-varying interference signal S(t), in which at least one of the encoder scale and the interferometry system is moveable with respect to the other, and imperfections in the interferometry system and/or input beam produce one or more errors that modify the time-varying interference signal S(t). The apparatus includes an electronic processor configured to, during operation of the apparatus, perform operations that include obtaining one or more error correction signals based on the one or more errors, and outputting information about a change in a position of the encoder scale relative to the interferometry system based on the time-varying interference signal S(t) and the one or more error correction signals.

Embodiments of the apparatus can include one or more of the following features and/or features of other aspects. In some implementations, the one or more errors cause the time-varying interference signal S(t) to deviate from an ideal expression of the form $A_1 \cos(\Phi_R(t)+\Phi(t)+\zeta_1)$, where $A_1$ and $\zeta_1$ are constants, $\Phi_R(t)$ is a time-varying reference phase equal to $\omega_R t$ where $\omega_R$ is an angular frequency difference between the first beam and the second beam, and $\Phi(t)$ is a phase difference indicative of an optical path difference between the first beam and the second beam. The interferometry system can be further configured to, during operation of the apparatus: provide an input beam, derive a reference beam from a first portion of the input beam, measure $\Phi_R(t)$ from the reference beam, and derive the first beam and the second beam from a second portion of the input beam.

In some implementations, the electronic processor is further configured to perform operations that include applying a frequency transform to the time-varying interference signal S(t) to generate a complex measurement signal. Applying the frequency transform can include applying a Discrete Fourier Transform (DFT) to the time-varying interference signal S(t). The DFT can include a window function. The DFT can be folded. Applying the frequency transform to the time-varying interference signal S(t) can include digitizing the time-varying interference signal S(t) to produce a digitized measurement signal. Applying the frequency transform to the time-varying interference signal S(t) can further include converting a series of consecutive samples of the digitized measurement signal into the complex measurement signal.

In some implementations, the electronic processor is further operable to perform operations including compensating the complex measurement signal based on the one or more error correction signals to provide the information about the change in the position of the encoder scale relative to the interferometer. Compensating the complex measurement signal can include subtracting the one or more error correction signals from the complex measurement signal. Obtaining one or more error correction signals can include obtaining one or more error basis functions representative of the one or more errors, obtaining one or more factors relating to at least one of amplitude or offset phase of one or more cyclic error terms, and generating the one or more error correction signals based on the one or more error basis functions and the one or more factors. The one or more factors can be complex factors. Obtaining the one or more factors can be based on values from the complex measurement signal.

In some implementations, the one or more error correction signals includes an error correction signal representative of a negative Doppler error.

In some implementations, the one or more error correction signals can include an error correction signal representative of a baseband Doppler error, where the baseband Doppler error is independent of the reference beam phase $\Phi_R(t)$.

In some implementations, the one or more error correction signals includes an error correction signal representative of a zero Doppler error.

In some implementations, outputting the information about the change in the position of the encoder scale relative to the interferometer includes reducing contributions from the one or more errors based on the one or more correction signals to produce a corrected time-varying interference signal. Outputting the information about the change in the position of the encoder scale relative to the interferometer can further include determining information indicative of an optical path difference between the first beam and the second beam from the corrected time-varying interference signal.

In some implementations, the apparatus further includes the encoder scale. The encoder scale can be a grating. The grating can be a one-dimensional grating. The grating can be a two-dimensional grating.

In some implementations, the apparatus further includes a light source configured to provide an input beam including a first component and a second component, the first component and the second components having different angular frequencies and orthogonal polarization states. The apparatus can further include one or more first components arranged to derive a primary beam from the input beam, and direct the primary beam toward the encoder scale. The one or more first components can include a first polarizing beam splitter arranged to derive the primary beam and the second beam from the input beam. The apparatus can further include one or more second components arranged to receive the first beam diffracted from the encoder scale, and combine the first beam with the second beam. The one or more second components can include a polarizing beam combiner arranged to combine the first beam with the second beam to form the output beam.

In some implementations, the apparatus further includes a detector to detect the output beam.

In general, in another aspect, the disclosure features a computer program product, encoded on a computer-readable medium, operable to cause a data processing apparatus to perform operations that include obtaining, from an interferometer, a time-varying interference signal S(t) based on a combination of a first beam and a second beam, the first beam being diffracted from an encoder scale, in which at least one of the encoder scale and the interferometer is moveable with respect to the other, obtaining one or more error correction signals based on one or more errors that modify the time-varying interference signal S(t), and outputting information about a change in a position of the encoder scale relative to the interferometer based on the time-varying interference signal S(t) and the one or more error correction signals.

In general, in another aspect, the disclosure features a lithography system that includes a moveable stage for supporting a wafer, in which the moveable stage includes an encoder scale that moves with the moveable stage, an illumination system configured to image radiation onto the wafer during operation of the lithography system, a positioning system configured to adjust a position of the moveable stage during operation of the lithography system, and an interferometry system configured to, during operation of the lithography system: direct a primary beam toward the encoder scale; and combine a first beam diffracted from the encoder scale and a second beam to produce an output beam corresponding to a time-varying interference signal S(t), in which imperfections in the interferometry system produce one or more errors that modify the time-varying interference signal S(t). The system further includes an electronic processor configured to, during operation of the lithography system, perform operations including obtaining one or more error correction signals based on the one or more errors and outputting information about a change in a position of the encoder scale relative to the interferometry system based on the time-varying interference signal S(t) and the one or more error correction signals.

Implementations disclosed herein can offer several advantages. For example, in some implementations, the methods and apparatus can be used to compensate for homodyne or baseband Doppler cyclic errors without the need for filtering, where the filtering would otherwise limit the maximum allowed Doppler shift. Accordingly, compensation of the cyclic errors enables larger Doppler shifts up to 16 MHz or more. The wider frequency range also allows, in some implementations, the use of a finer grating pitch for the encoder scale so that a smaller package can be employed and higher measurement resolutions can be achieved.

The details of one or more embodiments are set forth in the accompanying drawings and the description below. Other features and advantages of the invention will be apparent from the description and drawings, and from the claims.

BRIEF DESCRIPTION OF DRAWINGS

FIG. 1 is a schematic diagram of an exemplary interferometric encoder system.

FIG. 2A is a schematic diagram of another exemplary interferometric encoder system.

FIG. 2B is a schematic diagram of another exemplary interferometric encoder system.

DETAILED DESCRIPTION

Figure 3:
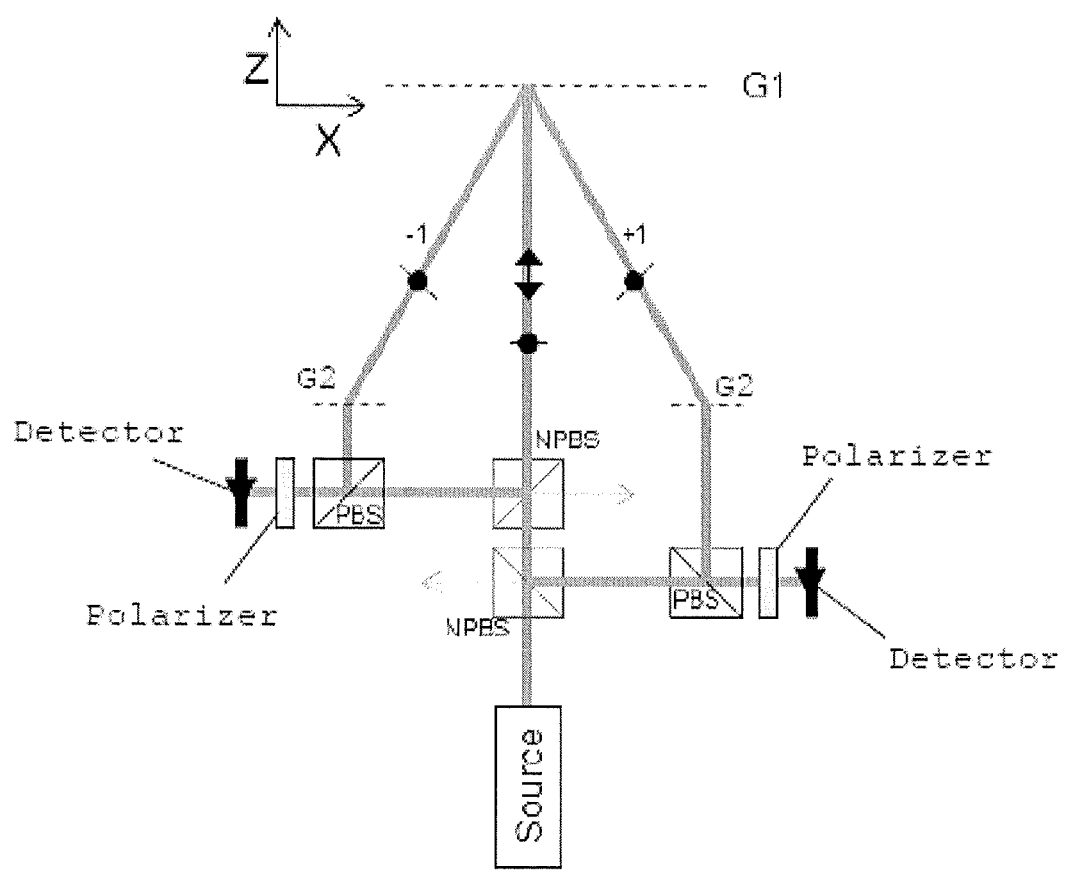
FIG. 3 is a schematic diagram of another exemplary interferometric encoder system.

The present disclosure is directed towards cyclic error compensation in interferometric encoder systems. The disclosure below is organized into four sections. A first section of the disclosure, entitled "Interferometric Encoder Systems," relates to a general description of how an interferometric encoder may operate. A second section of the disclosure, entitled "Cyclic Error Sources," relates to the optical sources of cyclic errors. A third section, entitled "Cyclic Error Correction," relates to structures and methods for correcting cyclic errors in interferometric encoder systems. A fourth section of the disclosure entitled, "Lithography Systems," relates to structures and methods for employing the interferometric encoder system in a lithography system.

Interferometric Encoder Systems

An interferometric encoder system is a type of interferometric measurement system that is capable of evaluating the motion of a measuring graduation, generally referred to as an "encoder scale," in one or more displacement directions. During operation of an interferometric encoder system, an input illumination beam is separated into two beams, one beam of which is incident on, and diffracts from, a moveable encoder scale, and the other beam of which is recombined with the diffracted beam to produce an interferometry signal indicative of changes in the relative position of the encoder scale. In some implementations, both beams are incident on and diffract from the moveable encoder scale.

In certain embodiments, the two beams have orthogonal polarizations so that polarization-sensitive optics can be used to separate them from the input illumination beam, direct them along their respective paths, and recombine them.

Furthermore, in certain embodiments, the two beams have a small difference in frequency (e.g., a difference in the kHz to MHz range) to produce an interferometry signal of interest at a frequency generally corresponding to this frequency difference. This frequency is hereinafter referred to interchangeably as the "heterodyne" frequency or the "reference" frequency, and is denoted as $\omega_R$ (with respect to angular frequency). Information about the changes in the relative position of the encoder scale generally corresponds to a phase of the interferometry signal at this heterodyne frequency. Signal processing techniques can be used to extract this phase. In general, the moveable encoder scale causes this phase term to be time-varying. In this regard, the first order time derivative of the encoder scale movement causes the frequency of the interferometry signal to shift from the heterodyne frequency by an amount referred to herein as the "Doppler" shift.

In preferred embodiments of the interferometric encoder system, a source provides the input illumination beam to have two orthogonally polarized components having the heterodyne frequency difference.

Encoder scales typically include a structure that extends periodically along at least one dimension and can diffract an incident beam. An example of a particular type of encoder scale is a grating, where the grating includes a periodic pattern (e.g., a binary pattern) repeating in one or more dimensions. Encoder scales are used extensively in lithographic applications due to their relative insensitivity to atmospheric turbulence, generally the primary error source of displacement measuring interferometers.

Referring now to FIG. 1, an interferometric encoder system 100 includes a light source 120, an optical assembly 110, a target 101, a detector system 130 (e.g., including a polarizer and a detector), and an electronic processor 150. A Cartesian coordinate system is shown for reference.

Target 101 includes an encoder scale 105, such as a grating, having grating lines that extend orthogonal to the plane of the page, parallel to the y-axis of the Cartesian coordinate system shown in FIG. 1. The grating lines are periodic along the x-axis. Encoder scale 105 has a grating plane corresponding to the x-y plane. During operation, encoder system 100 monitors one or more degrees of freedom of target 101 with respect to optical assembly 110, including a position of target 101 with respect to the x-axis.

To perform the monitoring, source 120 directs an input beam 122 to optical assembly 110. Optical assembly 110 derives a primary beam 112 from input beam 122 and directs primary beam 112 to target 101. Encoder scale 105 diffracts incident primary beam 112 into one or more diffracted orders. At least one of these diffracted orders, e.g., beam 114 in FIG. 1, returns to optical assembly 110, where it is combined with a second beam (not shown) to form an output beam 132. The second beam also can be derived from input beam 122. Each of the primary beam 112 and the second beam can be derived from the input beam 122 using one or more first optical components (not shown) of the optical assembly 110. For example, the primary beam 112 and second beam can be derived using a beamsplitter which splits the input beam 122 based on the polarization and/or frequency of the input beam 122. Similarly, the diffracted beam 114 and the second beam can be combined using one or more second optical components (not shown) of the optical assembly 110. For example, the diffracted beam 114 and the second beam can be combined using a polarizing beam combiner.

In preferred embodiments, the diffracted beam 114 is a non-zeroth order diffracted beam. The output beam 132 includes phase information related to the optical path difference between the component corresponding to the first beam and the component corresponding to the second beam. Optical assembly 110 directs output beam 132 to detector system 130 that detects the output beam and sends a signal to electronic processor 150 in response thereto.

Electronic processor 150 receives and analyses the signal and determines information about one or more degrees of freedom of target 101 relative to optical assembly 110. Specifically, the electronic processor determines this information based on a heterodyne phase of the signal, which arises because of how the source, optical assembly, and detection system are configured. In particular, the encoder system is provided so that the first and second beams have orthogonal polarizations and different (optical) frequencies (the difference of which defines a "heterodyne" frequency). The different (optical) frequencies can be produced, for example, by laser Zeeman splitting, by acousto-optical modulation, using two different laser modes, or internal to the laser using birefringent elements, among other techniques. The orthogonal polarizations allow a polarizing beam-splitter to direct the first and second beams along different paths, respectively, and combine the first and second beams to form the output beam that subsequently passes through a polarizer, which mixes the components so they can interfere. In the absence of target motion the interference signal oscillates at the heterodyne frequency, which is just the difference in the optical frequencies of the two components. In the presence of motion the heterodyne frequency incurs a change related to the velocity of the target through well-known Doppler relations. Accordingly, monitoring changes in the heterodyne frequency allows one to monitor motion of the target relative to the optical assembly.

In preferred embodiments, the primary beam is incident on encoder scale 105 at an incident angle such that the first beam does not satisfy the Littrow condition. The Littrow condition refers to an orientation of a grating with respect to an incident beam where the grating directs the diffracted beam back towards the source. In other words, in encoder system 100, the first beam is non-co-linear with the primary beam at the grating.

The "input beam" refers to the beam emitted by the light source. Generally, the input beam includes a component corresponding to the first beam and a component corresponding to the second beam. In other words, the input beam contains a component at a first frequency and polarization and another component at a different frequency at the orthogonal polarization. The "primary beam" refers to the beam that is initially incident on the encoder scale. In some instances, the primary beam is the same as the input beam (e.g., where the input beam is directed directly from the source to the target without interacting with beamsplitters, for example). In some embodiments, the primary beam contains a component corresponding to the first beam and a component corresponding to the second beam (e.g., two orthogonally polarized components at different angular frequencies). In certain embodiments, the input beam is split into the primary beam and the second beam before the primary beam contacts the target, so that the primary beam only contains the polarization/frequency component of the first beam.

While encoder scale 105 is depicted in FIG. 1 as a grating structure that is periodic in one direction, more generally, "encoder scales" refer to measuring graduations that include a structure that extends along at least one dimension and diffracts the primary beam. In some embodiments, encoder scales can have periodic structures extending in two directions (e.g., along the x- and y-axis). In general, the encoder scale and source are selected so that the encoder system provides a signal with sufficient strength and accuracy to monitor the degree of freedom of the target with a desired accuracy. In some embodiments, the source has a wavelength in a range from 400 nm to 1,500 nm. For example, the source can have a wavelength of about 633 nm or about 980 nm. In some embodiments, the source can be a HeNe laser. If a grating is used as the encoder scale, the grating can have a pitch in a range from about $1\lambda$ to about $20\lambda$, where $\lambda$ is a wavelength of the source. For example, the grating can have a pitch in a range from about 1 µm to about 10 µm.

In some embodiments, only one interfered frequency component is influenced by the target encoder scale. For example, referring to FIG. 2A, an optical assembly 110 of an interferometric encoder system includes a first polarizing beam splitter (PBS) 210, a second PBS 220, a grating G2, and polarizer (labeled "pol"), and a detector 230. PBS 210 splits input beam 122 into primary beam 112 and the secondary beam. As shown, primary beam 112 is polarized in the place of the figure, while the secondary beam is polarized orthogonal to the plane of the figure. Primary beam 112 is diffracted by encoder scale 105, providing first beam 114 which corresponds to a non-zeroth diffracted order (e.g., first order) of primary beam 112. Grating G2 diffracts first beam 114 so that it is incident on PBS 220 along a path parallel to the path of primary beam 112. PBS 220 combines first beam 114 with the second beam to form output beam 132. At detector system 130, the polarizer (pol) mixes the first and second beam components of the output beam before the output beam is incident on detector 230.

In some embodiments, primary beam 114 can include both frequency and polarization components. For example, referring to FIG. 2B, a non-polarizing beam splitter (NPBS) can be used to split the input beam into the primary beam and the second beam. However, the first beam and second beam are combined using a PBS so that the only portion of the first beam in the output beam corresponds to the component polarized in one state, and the only portion of the second beam in the output beam corresponds to the component having the orthogonal polarization.

Furthermore, in general, optical assembly 110 can include one or more components in addition, or as alternative, to those components shown in FIG. 2A. For example, in some embodiments, diffracted beam 114 can be redirected to PBS 220 using a bulk optic component (e.g., a prism or other refractive optical element) instead of grating G2. Such an embodiment is shown in FIG. 2B.

In certain embodiments, the encoder system includes additional subsystems. For example, in some embodiments, the encoder system includes a local reference. As depicted in FIG. 2A, a local reference can be provided using a beam splitter 240 (e.g., a non-polarizing beam splitter), polarizer 250, and a detector 260. Such a reference can be useful, for example, in embodiments where the relative starting phase between the components of input beam 122 is variable.

Further embodiments are contemplated that are based on the embodiments depicted in FIGS. 2A and 2B. For example FIG. 3 shows a variant that incorporates two detection channels, each of which interfere either the +1 or −1 diffracted orders separately to both improve motion sensitivity resolution and distinguish between encoder scale motion along the primary beam axis (i.e., the Z-axis). Here, the second beam for each detection channel corresponds to the zeroth order diffraction of the primary beam, which is nominally normally incident on the encoder scale G1. Since encoder scale motion in the Z direction is common to both, while encoder scale motion along X is detected with opposite signs, the two motions can be distinguished by a composite signal consisting of the sum or difference of the two separate phases. For this case the basic equations for the change in phase as a function of motion along X ($\Delta x$) and motion along Z ($\Delta z$) for the two detectors are $$\varphi^+ = \frac{2\pi}{\Lambda}\Delta x + \frac{2\pi}{\lambda}(1+\cos(\theta))\Delta z$$

$$\text{and } \varphi^- = -\frac{2\pi}{\Lambda}\Delta x + \frac{2\pi}{\lambda}(1+\cos(\theta))\Delta z$$

where the ± superscripts represent + or − order, $\lambda$ is the illumination wavelength, $\Lambda$ is the period of the encoder scale pattern (e.g., a grating period) and the $1^{st}$ order diffraction angle ($\theta$) is found from the equation $\lambda=\Lambda \sin(\theta)$. To obtain the displacements one forms the sum and difference equations $$\Delta z = \frac{\varphi^+ + \varphi^-}{4\pi}\left(\frac{\lambda}{1+\cos(\theta)}\right)$$

$$\text{and } \Delta x = \frac{\varphi^+ - \varphi^-}{4\pi}\Lambda.$$

For 2-dimensional (2D) applications using an area grating, the motion in the perpendicular (Y) axis can be obtained with another set of components rotated 90 degrees about Z from the first, for example, providing two additional detection channels that provide a displacement in the Y-direction, $\Delta y$.

Cyclic Error Sources

Prior to describing embodiments of cyclic error correction, it is useful to discuss the sources and types of cyclic errors that occur in interferometric encoder systems. In general, optical cyclic errors can be introduced into an interferometric encoder system through "beam mixing," in which spurious "ghost" beams interfere with other desired beams, such as a measurement beam and/or a reference beam, in the system. These ghost beams may have different amplitudes, different phase offsets, and/or different frequencies from the beams with which they combine, resulting in a shift in a detected interference signal frequency or phase, or a change in detected interference signal amplitude. Accordingly, measurements of the relative position of the encoder scale may deviate from the encoder scale's actual position, thus limiting the accuracy of displacement changes measured by the interferometer.

Ghost beams can be caused by various imperfections in the interferometer system. For example, ellipticity in the polarizations of the different frequency components of the input beam may lead to leakage through a polarizing beam splitter that is used to split the input beam along respective measurement and reference paths. That is to say, a portion of the primary beam having a first polarization and frequency may exit the beam splitter along the reference path instead of the measurement path as intended, whereas a portion of the second beam having a second different polarization and frequency may exit the beam splitter along the measurement path instead of the reference path as intended. Elliptical polarization in the input beam may be due to polarization mixing inherent in the illumination source. Leakage through a polarizing beam splitter also may be caused by imperfections in the beam splitter, itself. For example, in some cases, the polarizing beam splitter may have a low extinction ratio, where the extinction ratio is the transmission of an unwanted beam component relative to the beam wanted component. In some cases, leakage through a polarizing beam splitter is due to misalignment of the input beam with the beam splitter's plane of polarization.

Ghost beams also can arise due to unwanted reflections from other components of the interferometer system. For example, in some cases, quarter wave plates may not enable 100% beam transmission, such that a portion of the beam incident on the wave plate is unintentionally reflected into a measurement path or reference path. Similarly, reflections from the encoder scale also may lead to ghost beams. For example, in some implementations, a portion of the input beam is reflected back along the incident direction instead of being diffracted along a path that is non-co-linear with the input beam. It should be noted that the foregoing examples of sources of cyclic errors are not exhaustive and that other mechanisms for generating such errors also exist.

Figure 4:
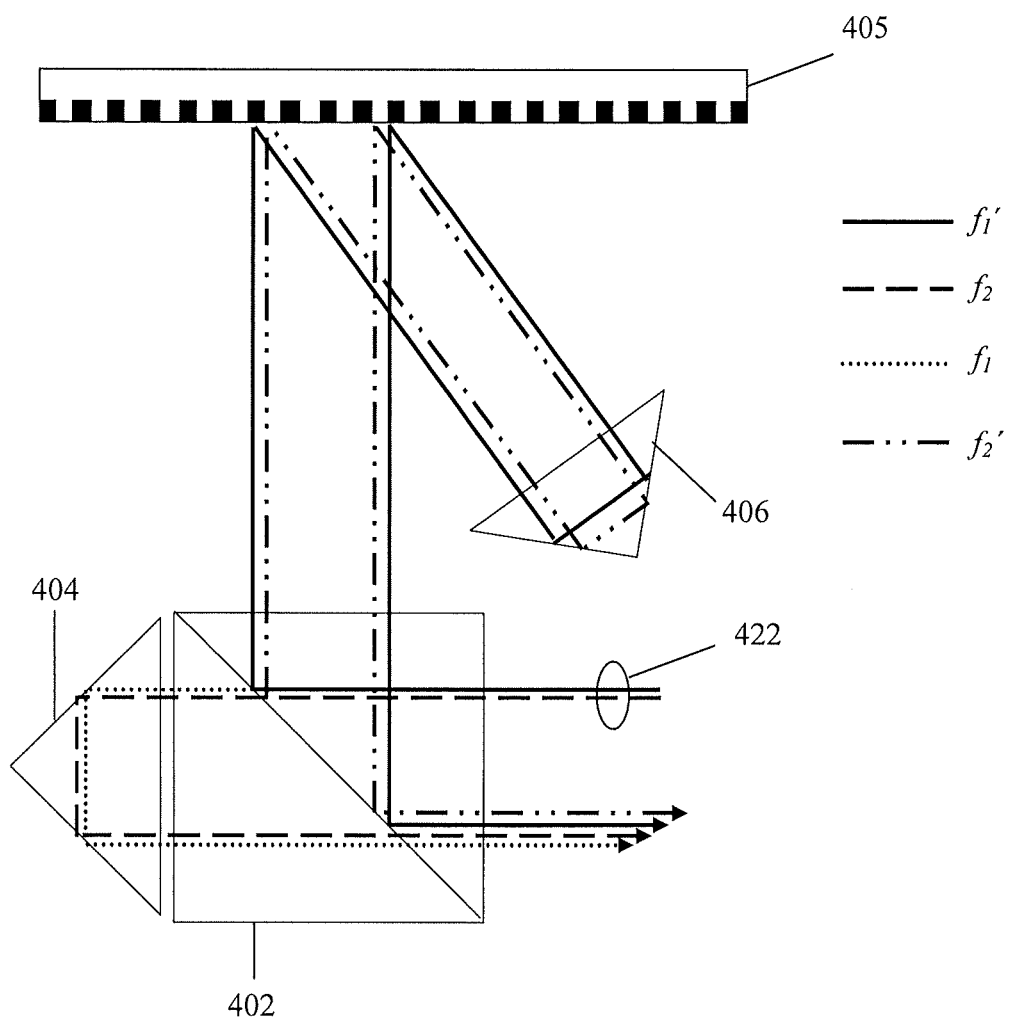
FIG. 4 is a schematic diagram of different beam paths in an exemplary interferometric encoder system.

A schematic diagram illustrating examples of the different beam paths travelled by a measurement beam (e.g., a primary beam derived from an input beam), a reference beam (e.g., a second beam derived from the input beam), and ghost beams resulting from polarizing beam splitter leakage in an interferometric encoder system is shown in FIG. 4. It should be noted that FIG. 4 illustrates a portion of an example configuration of an interferometric encoder system, whereas other configurations or arrangements of optical components also may be used.

In the example shown in FIG. 4, an input beam 422 from a source (not shown) is incident on a polarizing beam splitter 402. The input beam 422 contains a component at a first frequency and first polarization and another component at a different frequency at the orthogonal polarization. The polarizing beam splitter 402 serves to split the input beam 422 into a measurement beam, $f_1'$, having the first polarization and first frequency, and a second beam, $f_2$, having the second polarization and second frequency. The measurement beam $f_1'$ is directed along a measurement path toward the encoder scale 405 where the measurement beam then is diffracted resulting in a Doppler shifted measurement beam $f_1'$ (where the Doppler-shift in frequency caused by the moving encoder scale). In contrast, the second beam $f_2$ passes through the polarizing beam splitter 402 along a reference path. The Doppler shifted measurement beam $f_1'$ and the second beam $f_2$ then are redirected, using respective retro-reflectors 406, 404, back towards the polarizing beam splitter 402 where they are recombined. The Doppler shifted measurement beam $f_1'$ thus interferes with the second beam $f_2$ to provide an output beam from which information about the relative position of the moveable encoder scale can be determined.

However, as explained above, cyclic errors may arise due to imperfections in the system, such as beam leakage in the polarizing beam splitter 402. For example, in some cases, a portion ($f_1$) of the initial measurement beam "leaks" through the polarizing beam splitter 402 and travels along the reference beam path instead of the measurement beam path. The non-Doppler-shifted measurement beam $f_1$ is redirected by retro-reflector 404 such that the beam contributes to the output beam. Similarly, in some implementations, a portion ($f_2'$) of the second beam is redirected by the polarizing beam splitter 402 along the measurement path, where it is Doppler shifted by the encoder scale 405 to produce a Doppler shifted second beam, instead of traveling along the reference path. The Doppler shifted second beam $f_2'$ is then redirected by the retro-reflector 406 towards the polarizing beam splitter 402 where it is combined with the Doppler shifted measurement beam $f_1'$, the reference beam $f_2$, and the non-shifted measurement beam $f_1$. Although the foregoing example pertains to ghost beams that have "leaked" through the polarizing beam splitter, other imperfections in the interferometer system may also give rise to spurious signals that cause the output beam to deviate including, for example, unwanted reflections from other optical components in the interferometric system and from illumination sources having less than ideal polarization extinction ratios.

Interference of the desired beams and the ghost beams, whether from leakage or other imperfections in the interferometer system, can lead to various types of cyclic errors that cause deviations in the detected output beam. The types of cyclic errors are listed in Table 1 below.

TABLE 1

| Interfering Beams | Term |
|---|---|
| $f_1, f_2$ | CE 0 |
| $f_1', f_2$ | Measurement Signal |
| $f_1, f_2'$ | CE N |
| $f_1', f_2'$ | CE 0 |
| $f_1', f_1$ | CE B |
| $f_2', f_2$ | CE B |

A first type of cyclic error is the zero Doppler shifted error (CE 0), where one or more ghost beams interfere to give rise to an error that is not-shifted in frequency from the heterodyne frequency difference between the components of the original input beam. Zero Doppler shifted errors include errors in the output interference signal caused by the non-shifted second beam $f_2$ interfering with the non-shifted measurement beam $f_1$. Zero Doppler shifted errors also include errors in the output interference signal caused by interference of the Doppler shifted measurement beam $f_1'$ with the Doppler shifted second beam $f_2'$.

A second type of cyclic error is the negative Doppler shift error (CE N), where ghost beams interfere to give rise to a signal that is Doppler shifted in the opposite direction to the frequency shift of the desired output signal. Negative Doppler errors include errors in the output signal caused by the non-shifted measurement beam $f_1$ interfering with the Doppler shifted second beam $f_2'$.

A third type of cyclic error is the baseband Doppler shift error (CE B). Baseband Doppler shifted errors affect the measured position when the ghost beam frequency is near the Doppler shifted measurement signal frequency. Baseband Doppler shifted errors include errors in the output signal caused by interference of the Doppler shifted measurement beam $f_1'$ with the non-shifted measurement beam $f_1$. Baseband Doppler shifted errors also include errors in the output signal caused by interference of the Doppler shifted second beam $f_2''$ with the non-shifted second beam $f_2$. The baseband Doppler shifted cyclic error exists in displacement measuring interferometer (DMI) systems, but typically has a magnitude low enough that it does not substantially affect the output interference signal. Furthermore, in some cases, application of a signal processing technique to reduce the amplitude of the baseband Doppler error in DMI systems can generate additional unwanted error signals at other frequencies, where the additional error signals may even have greater magnitude than the baseband Doppler error.

In contrast, baseband Doppler shifted cyclic errors in interferometric encoder systems can, in some implementations, exhibit much larger magnitude relative to such errors in DMI systems. This is due, in part, to the relatively lower efficiency of encoder systems. In other words, the efficiency of beam reflecting from a stage mirror in a DMI system is far greater than that for a beam diffracting along a specific order from an encoder scale in an interferometric encoder system. As a result, whereas the proportion of a measurement signal that reaches a detector relative to an input beam in DMI systems can be greater than 50%, the efficiency of encoder systems typically has a best-case efficiency closer to 12% or less for a double-pass one-dimensional encoder scale, or 6% or less for a double-pass two-dimensional encoder scale. Accordingly, the contribution of baseband Doppler errors to the detected output beam is significantly larger. Furthermore, in some cases, the gradation period of the encoder scale is coarser than the interference period of a comparable DMI, such that the baseband Doppler shifted error will cause a larger error in the measured interference signal. In some implementations, the baseband Doppler errors in encoder systems are also more pronounced than in DMI systems due to the speed at which the encoder scale moves. In particular, the frequency interval over which the baseband Doppler error arises can be shifted to within the measurement frequency band depending on the encoder scale velocity.

Cyclic Error Correction

Typically, cyclic error effects can be eliminated by filtering the interference signal of the detected output beam in frequency space, e.g., using Fourier spectral analysis, combined with filtering of the resulting position value, e.g., with a 100 kHz lowpass filter (e.g., at operating speeds greater than 0.25 m/s). For baseband Doppler shift errors, however, such filtering techniques are ineffective in the velocity range where the frequency of the Doppler shifted measurement signal is near (e.g., ±1 MHz) the frequency of the baseband Doppler signal (e.g., both signals in the range of 10±0.5 MHz). For example, in a double-pass interferometric encoder system, with a grating pitch of 500 nm, a reference frequency of 20 MHz, and a desired 10× reduction in cyclic error amplitude, the velocity range would be about 2.5±0.12 m/s. The cyclic error and the limitations of filtering methods can limit the maximum usable velocity (e.g., 2.13 m/s) of interferometric encoder systems, which would otherwise have a higher limit (e.g., 4 m/s).

Employing cyclic error compensation techniques using signal processing, however, can reduce baseband Doppler shifted errors at higher encoder scale speeds while extending the frequency limit over which the Doppler shift can be employed. The wider frequency range also allows use of a finer grating pitch to obtain other interferometer performance benefits such as enabling higher resolution and smaller encoder scale packaging. In addition, when combined with optical methods for reducing cyclic errors, cyclic error compensation utilizing signal processing can achieve greater reduction in cyclic error magnitude for baseband Doppler shift errors as well as zero Doppler shift and negative Doppler shift errors.

In one approach, the CEC procedure processes real time-sampled values of a digitized measurement signal (DMS) generated by an analog-to-digital-converter (ADC). This is known as the "DMS approach." Advantages of the DMS approach include a cyclic error correction signal that may be generated in a "feed forward mode," where the feed forward mode can involve a simple discrete transform based on a translation in time and need not require a spectral analysis or the use of a discrete transform.

In another embodiment, the CEC procedure processes complex values of a complex measurement signal (CMS) generated by a discrete Fourier transform (DFT) module. Advantages of this "CMS approach" include the ability to update the DFT (and the CEC computations) at a lower rate (e.g., 10 MHz) than the ADC sampling rate (e.g., 120 MHz). A reduction in the CEC update rate enables a simplified hardware architecture. For example, a reduction in CEC update rate by a factor of 12 can result in a hardware savings of greater than a factor of 12 relative to the DMS approach. The CMS approach also eliminates cyclic errors that are due to finite arithmetic precision of the samples generated by the ADC and of the DFT coefficients and calculations in the DFT module. The CMS approach is also less subject to noise than the DMS approach due to the number of samples and the window function used by the DFT module.

Another advantage of both the DMS approach and the CMS approach is that the cyclic error coefficients can be characterized at Doppler shift frequencies for which the phase meter cannot distinguish between the cyclic error frequencies from the frequency of the primary component of the interference signal. Furthermore, the cyclic error coefficients can be characterized and used for compensation over a range of Doppler shift frequencies that is small relative to heterodyne frequency, which is a range over which the cyclic error coefficients are typically frequency independent, thereby simplifying the cyclic error correction.

We now describe the CMS approach for the CEC, in which a cyclic error correction signal $D_\omega \pi(t)$ is subtracted from a corresponding DFT signal $D(t)$ of an electrical interference signal $S(t)$ of an interferometric encoder system to produce a compensated DFT signal. The phase of the compensated electrical interference signal is then measured by a phase meter to extract relative encoder scale position information associated with the particular interferometer arrangement. Because cyclic error effects have been reduced, the relative encoder scale position information is more accurate. As a result, the compensated electrical interference phase can be used to measure and control through a servo control system the position of a moveable encoder scale, even at high velocities, where baseband Doppler shifted cyclic error effects can otherwise be especially problematic.

In the present embodiment, we focus on a particular set of two cyclic error terms that are compensated at low slew rates, and one cyclic error term that is compensated at a Doppler frequency $f_D$ near $-f_R/2$, where $f_R$ is the reference frequency. Adaptation to compensate for a different set of cyclic errors will be evident to one skilled in the art based on the subsequent description. As explained above, these three cyclic errors are herein referred to as negative Doppler (CE N), with amplitude $\epsilon_{-1}$ and offset phase $C_{-1}$; zero Doppler (CE 0), with amplitude $\epsilon_0$ and offset phase $\zeta_o$; and baseband Doppler, with amplitude $\epsilon_B$ and offset phase $\zeta_B$.

Referring again to FIG. 1, the output beam 132 detected by the detector system 130 contains a heterodyne interference signal corresponding to the main interference signal S(t). The electrical interference signal S(t) including the three cyclic error terms can be expressed in the form $$S(t) = A_1 \cos(\phi_R + \phi + \zeta_1) + S_\psi(t) \qquad (1)$$

where $$S_\psi(t) = S_{\psi-1}(t) + S_{\psi 0} + S_{\psi B}(t); \qquad (2)$$

$$S_{\psi-1}(t) = \epsilon_{-1} \cos(\phi_R - \phi + \zeta_{-1}), \qquad (3)$$

$$S_{\psi 0} = \epsilon_0 \cos(\phi_R + \zeta_0), \qquad (4)$$

$$S_{\psi B}(t) = \beta_B \cos(\phi + \zeta_B), \qquad (5)$$

$\phi_R$ is the phase of a reference signal $S_R(t)$ with $d\phi_R/dt = \omega_R$ corresponding to $2\pi$ times the frequency difference of the measurement beam and reference beam components of the input beam to the interferometer; $A_1$ and $\zeta_1$ are the amplitude and offset phase, respectively, of the primary component of the electrical interference signal; $\phi$ is the change in phase as a function of motion of the encoder scale along the X ($\Delta x$) and motion along Z ($\Delta z$), where for the +1 diffracted order $$\varphi = \frac{2\pi}{\Lambda}\Delta x + \frac{2\pi}{\lambda}(1 + \cos(\theta))\Delta z \qquad (6)$$

for a interferometric encoder system; k is a wavenumber corresponding to wavelength $\lambda$ of the output beam detected by the interferometer. An example of the heterodyne frequency difference $\omega_R/2\pi$ is 20 MHz.

Each cyclic error results in a characteristic cyclic error frequency in the measured displacement value. This frequency is the difference between the measurement signal frequency and the cyclic error signal frequency.

For $CE\ 0, w_0 = w_D$; (6)

for $CE\ N, w_{-1} = 2w_D$; (8)

for $CE\ B, w_B = W_R + 2w_D$, aliased to $2w_D$, (9)

where $W_D$ is the Doppler frequency.

Figure 5A:
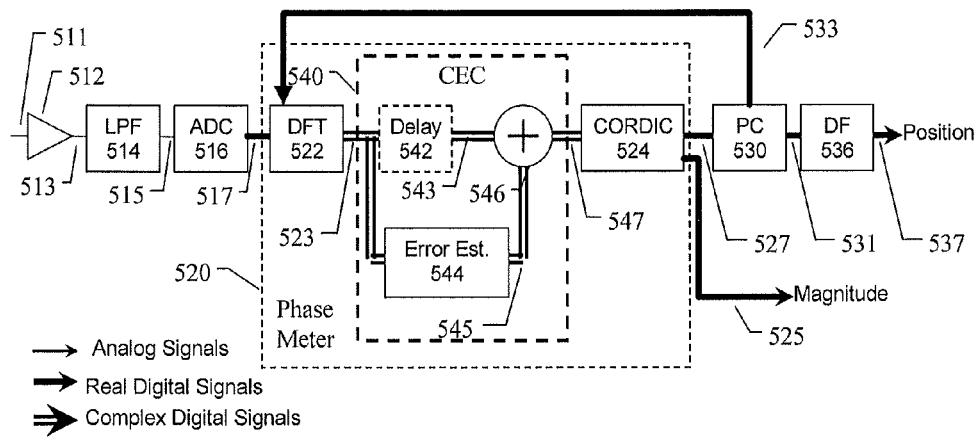
FIG. 5A is a schematic diagram of an exemplary measurement system for generating cyclic error basis functions and characterizing cyclic error coefficients based on a complex measurement signal.

FIG. 5A shows a simplified schematic diagram of a measurement using the CMS approach. The optical interference signal 511 is received and amplified by photoelectric receiver 512. The resulting electrical interference signal 513 is filtered by lowpass filter (LPF) 514 producing filtered signal 515. The LPF 514 is designed to prevent harmonics of the interference signal 511 from being aliased into the frequency range of interest. Filtered signal 515 is digitized by ADC 316, to produce digitized measurement signal 517. A typical ADC for a high performance displacement measuring interferometer may have 12 bits of resolution at sampling rates of 120 MHz. The digitized measurement signal 517 is processed by phase meter 520 (described below) to produce outputs magnitude 525 and phase 527 which represent the digitized measurement signal 517 as a transform. The magnitude output 525 is used for status and diagnostic purposes. The phase output 527 is used by position calculator 530 which is fully described in U.S. Pat. No. 6,975,406, incorporated herein by reference. Position calculator 530 calculates measured position 531 and estimated velocity 533. The measured position 531 is filtered by digital filter 536, which is fully described in U.S. Pat. No. 5,767,972, incorporated herein by reference, to generate filtered position signal 537. Filtered position signal 537 represents the desired measurement of the distance travelled by the encoder scale.

Phase meter 520 includes a Discrete Fourier Transform (DFT) processor 522, a cyclic error compensation (CEC) calculator 540, and a Coordinate Rotation by Digital Computer (CORDIC) converter 524. Signals 523, 543, 545, and 547 are complex values, which consist of both a real component and an imaginary component, as a+jb, where a is the real component, b is the imaginary component, and j is $\sqrt{-1}$. (The symbol i is sometimes used in the literature instead of j.) Other representations of complex or quadrature values can be used, and may be expressed using other symbols such as, for example, I and Q, or X and Y, or A and $\tilde{A}$. Complex values may be converted from rectangular (real and imaginary) representation to polar (magnitude and phase angle) representation. The numeric representation of the digital signals may be integer, fractional, or floating point.

The DFT processor 522 converts a series of consecutive samples of digitized measurement signal 517 into a complex measurement signal 523 representing a transform of the digitized measurement signal 517 at a selected center frequency of DFT processor 522. The center frequency is determined by control circuitry (not shown) and the estimated velocity 533 is determined by position calculator 530.

An exemplary DFT processor 522 is a 72-point windowed DFT performed at a 10 MHz rate. Since the DFT calculation is being updated in time, the complex measurement signal 523 is expressed as a function of time D (t). This 10 MHz update rate provides 83% overlap of samples of the digitized measurement signal 517 between one DFT calculation and the next for an ADC sampling rate of $f_S$=120 MHz. A typical window function is the Blackman window, which reduces errors due to the discontinuities at the beginning and end of the series of digitized measurement signal samples used for the DFT.

The CEC calculator 540 calculates and compensates for certain of the cyclic errors. CEC error estimator 544 (described in more detail below with reference to FIG. 5B) calculates complex error compensation signal 545. Optional delay 542, and other delays (not shown) in CEC calculator 540 may be used to match the processing delay of the various calculations. Adder 546 combines delayed complex measurement signal 543 with complex error compensation signal 545 to produce compensated complex measurement signal 547, in which the certain cyclic error signals are substantially reduced.

CORDIC converter 524 converts the compensated complex measurement signal 547 to magnitude 525 and phase 527.

Figure 5B:
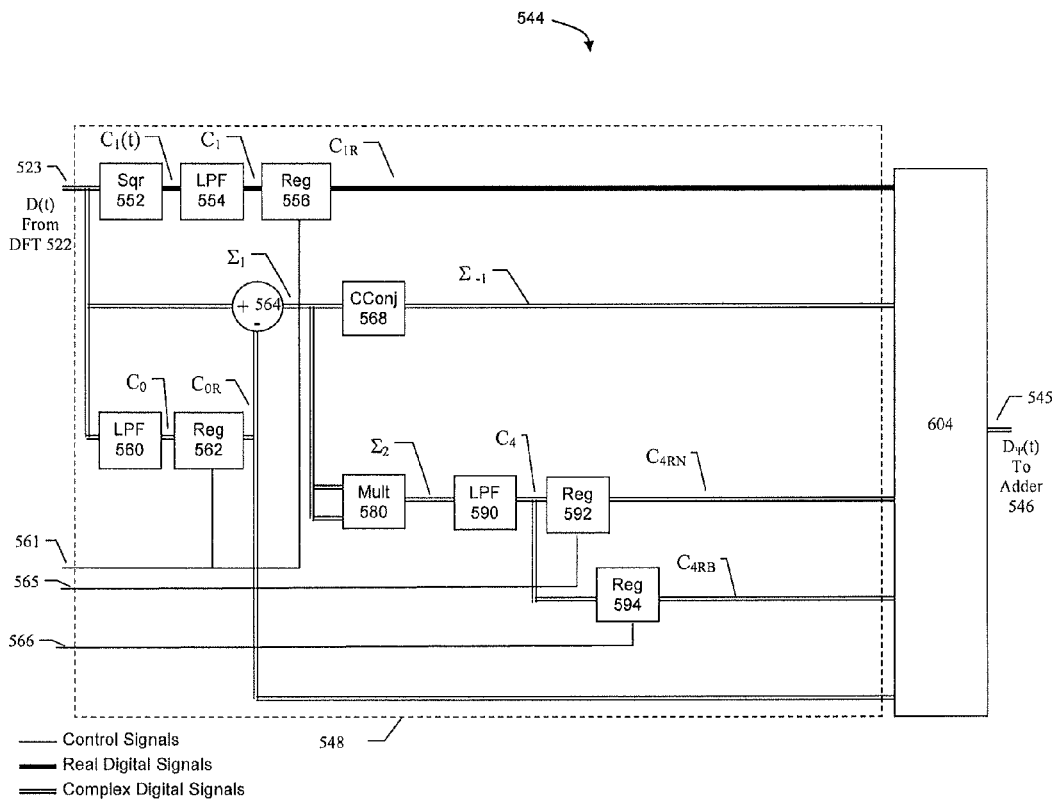
FIG. 5B is a schematic diagram of an error estimator for the measurement system of FIG. 5A.

Referring to FIG. 5B, the CEC error estimator 544 includes two processing units. One processing unit 548 determines error basis functions and complex factors relating to the amplitudes and offset phases of the certain cyclic errors that need be compensated. A second processing unit 604 generates complex error compensation signal $D_\psi(t)$ 545 using the error basis functions and complex factors relating to the amplitudes and offset phases determined by first processing unit 548.

Figure 5C:
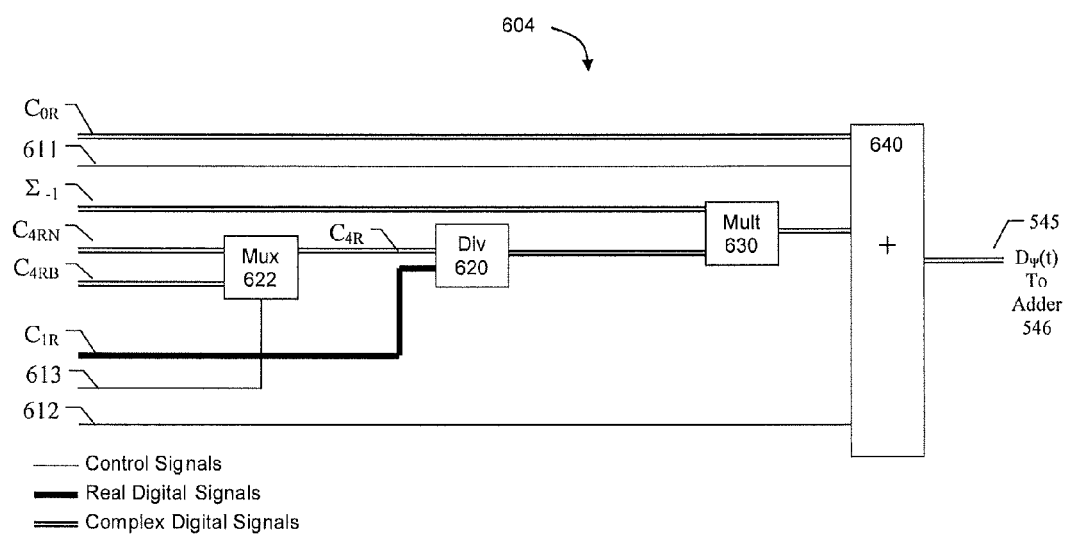
FIG. 5C is a schematic diagram of a processing unit for the error estimator of FIG. 5B.

The first processing unit 548 for one embodiment is shown schematically in FIG. 5B and the second processing unit 604 of this embodiment is shown schematically in FIG. 5C. These processing units are incorporated into the architecture shown in FIG. 5A that may also include any of a variety of other techniques such as a glitch filter (as described in published U.S. Pat. No. 6,975,406), dynamic data age adjustment (as described in U.S. Pat. No. 6,597,459, incorporated herein by reference), and digital filtering as described in U.S. Pat. No. 5,767,972.

The first order cyclic error term whose phase is independent of $\omega_R$ is included in Equation (5). The set of higher cyclic order terms, whose phases are independent of $\omega_R$, have been omitted from Equation (2) because they are generally insignificant.

Complex factors relating to amplitudes $\epsilon_1$, and offset phases $\zeta_p$ of the three cyclic error terms and time dependent factors of the cyclic error terms are generated using processed values D(t) 523 from DFT processor 522. The factors are stored in registers 562, 592 and 594 for subsequent use in generation of the cyclic error correction signal $D_\psi(t)$ 545. The time dependent factors of the cyclic error terms are obtained by application of digital transforms based on trigonometric identities and properties of complex signals.

DFT processor 522 calculates the complex DFT of the digitized measurement signal 517 as:

$$D_q(t_1) = \sum_{n=0}^{N-1} W_n S(n\tau + t_1) \exp\left\{-j\left(2\pi\left(n - \frac{N-1}{2}\right)q/N\right)\right\}, \quad (10)$$

for 0≤q≤N−1, where $\tau=1/f_S$, $W_n$ is a window function centered at $$n = \frac{N-1}{2},$$

and $t_1$ is the time at which the DFT calculation is updated. When q is selected by control circuitry (not shown) as an integer approximately equal to $Nf_m/f_S$, to correspond to the center frequency of the primary component of the digitized measurement signal. A typical value for N is 72, and a typical window function $W_n$ is the Blackman window function.

The equation for the DFT is arranged so that the center of the sequence of the N consecutive samples of the digitized measurement signal 517 (n=35.5 in this case) corresponds to zero phase and the center of the window function. Therefore, since the window function and DFT coefficients (the complex exponential or equivalently the "cos+j sin" factors shown below) are symmetrical about the center, and window weighting is zero at the ends, a change in the value of q, has a reduced effect on the phase of the result.

The transform signal $D_q(t_1)$ is updated at a rate $f_U$ that is lower than the rate $f_S$ at which the signal S(t) is sampled. In this example, $t_1 = l\Delta t_1$ (where l is an integer and $\Delta t_1 1/f_U$ is the update interval) and $f_U$=10 MHz.

Alternatively, the DFT equation can be "folded" to reduce the number of multiplication operations that are performed and calculated as:

$$D_q(t_1) = \quad (11)$$

$$\sum_{n=0}^{\frac{N}{2}-1} W_n(x_n(t_1) + x_{N-1-n}(t_1))\left(\cos\left(2\pi\frac{n+0.5}{N}\frac{q}{8}\right) + j\sin\left(2\pi\frac{n+0.5}{N}\frac{q}{8}\right)\right)$$

for $0 \leq q < 8N-1$, where $x_n(t_1)$ for $n=0, \ldots, N-1$ are N consecutive samples (i.e., $t=n\tau$) of $S(t+t_1)$, and $W_n$ is centered at $n=-\frac{1}{2}$. In this example, the larger range of q yields a more finely spaced resolution of $\frac{1}{8}$ bin to reduce amplitude variations (or "picket fence" effect) as the frequency changes from one bin to the next.

In this embodiment, N is even. An alternate embodiment with odd N is possible, although less convenient, with suitable adjustments to the equations.

The DFT function is equivalent to a mixing and a filtering operation. The mixing is a result of multiplying the input data by the complex exponential or equivalently the "cos+j sin" factor. The filtering is a result of the summation and the window function $W_n$.

Since the window function $W_n$ makes terms zero outside the range of summation, the DFT expression can be written as a sum over all n. In a simplified expression for an "unfolded" DFT (as in equation (10)), the digitized measurement signal $S(n\tau+t_1)$ 577 has been approximated by its primary term $A_1 \cos(\phi_R(n\tau+t_1)+\phi(n\tau+t_1)+\zeta_1)$, where explicit sampling ($t=n\tau$) has been included:

$$D(t_1) = A_1 \sum_n W_n \cos(\varphi_R(n\tau+t_1) + \varphi(n\tau+t_1) + \zeta_1) \quad (12)$$

$$(\cos(\varphi_C(n,q)) + j\sin(\varphi_C(n,q)))$$

where $\phi_R(n\tau+t_1) = \omega_R n\tau + \omega_R t_1$ and $\phi(n\tau+t_1) = \omega_D n\tau + \omega_D t_1 + \omega_0$ is the sampled version of the Doppler phase shift $\phi(t) = \omega_D t + \omega_0$, and $$\varphi_C(n, q) = 2\pi \frac{nq}{N}$$

is the phase of the DFT with $q \approx z \, Nf_M/f_S$, yielding $\phi_C(n,q) \approx 2\pi f_M n\tau = \omega_M n\tau$. (The q in $D_q(t_1)$ has been suppressed so that $D(t_1) \equiv D_q(t_1)$.) Using trigonometric identities, equation (12) can be expanded to (with time dependent arguments temporarily suppressed):

$$D(t_1) = A_1 \sum_n W_n \begin{bmatrix} \frac{1}{2}(\cos(\varphi_R + \varphi + \zeta_1 + \varphi_C) + \cos(\varphi_R + \varphi + \zeta_1 - \varphi_C)) + \\ j\frac{1}{2}(\sin(\varphi_R + \varphi + \zeta_1 + \varphi_C) - \sin(\varphi_R + \varphi + \zeta_1 - \varphi_C)) \end{bmatrix} \quad (13)$$

The terms containing $\phi_R+\phi+\zeta_1+\phi_C$ are high frequency sinusoids varying with n that are filtered out in the summation including the window function $W_n$ that covers many cycles. The constant $\frac{1}{2}$ may be dropped for convenience. The terms containing $\phi_R+\phi+\zeta_1-\omega_c$ that are slowly varying in the summation over the window remain:

$$D(t_1) \approx A_1 \sum_n W_n \begin{bmatrix} \cos(\omega_R n\tau + \omega_R t_1 + \omega_D n\tau + \omega_D t_1 + \varphi_0 + \zeta_1 - \omega_M n\tau) - \\ j\sin(\omega_R n\tau + \omega_R t_1 + \omega_D n\tau + \omega_D t_1 + \varphi_0 + \zeta_1 - \omega_M n\tau) \end{bmatrix} \quad (14)$$

Since $\omega_M \approx \omega_R + \omega_D$ the terms of the sinusoids including n drop out.

When the update interval $\Delta t_1 = 1/f_U$ is given by $\Delta t_1 = m/f_R$ (where m is an integer) the value of $t_1$ is a multiple of $1/f_R$. Under this condition, for low stage velocities (i.e., $\omega_D \ll \omega_R$) and for low aliased frequencies (i.e., for CE B when $\omega_D \approx -\omega_R/2$) $\omega_R t_1 \approx m2\pi$ and DFT calculation becomes:

$$D(t_1) \approx A_1 \sum_n W_n \begin{bmatrix} \cos(\omega_D t_1 + \varphi_0 + \zeta_1) - \\ j\sin(\omega_D t_1 + \varphi_0 + \zeta_1) \end{bmatrix} \quad (15)$$

$$\approx A_1[\cos(\omega_D t_1 + \varphi_0 + \zeta_1) - j\sin(\omega_D t_1 + \varphi_0 + \zeta_1)]$$

The DFT result is a complex value which can represent either a positive or a negative frequency. Equation (15) could be written as a sum, rather than a difference, with appropriate changes in sign in other equations. This choice of sign is not important, provided that the choices result in a reduction in cyclic error.

Equation (15) can be combined with equations (1) to (5). This results in:

$$D(t_1) = A_1(\cos(\phi(t_1)+\zeta_1) - j\sin(\phi(t_1)+\zeta_1)) + D_\psi(t_1) \quad (16)$$

where $$D_\psi(t_1) = D_{\psi-1}(t_1) + D_{\psi 0} + D_{\psi B}(t_1); \quad (17)$$

$$D_{\psi-1}(t_1) = \epsilon_{-1}(\cos(-\phi(t_1)+\zeta_{-1}) - j\sin(-\phi(t_1)+\zeta_{-1})), \quad (18)$$

$$D_{\psi 0} = \epsilon_0(\cos(\zeta_0) - j\sin(\zeta_0)), \quad (19)$$

$$D_{\psi B}(t_1) = \epsilon_B(\cos(-\phi(t_1)+\zeta_B) - j\sin(-\phi(t_1)+\zeta_B)), \quad (20)$$

where $\phi(t_1)$ is the value of the Doppler phase shift $\phi(t_1) = \omega_D t_1 + \phi_0$ that is updated with $t_1$. For convenience, in the equations (24)-(42) below, $t_1$ is written simply as t and $\phi(t_1)$ is written simply as $\phi$. Also, complex measurement signal D(t) 523 and complex error compensation signal $D_\psi(t)$ 545 are assumed to be updated at the rate $f_U$ such that $D(t) \equiv D(t_1)$ and $D_\psi(t) \equiv D_\psi(t_1)$.

Note that the terms of $D_\psi(t)$ depend on the Doppler shift $\omega_D$ and the stop band of the DFT processor, $\omega_{Stop}$. For a DFT with a Blackman window, the stop band is $-56$ dB at a frequency offset of $\pm 3$ bins, or in this example $\pm 5$ MHz. The $D_{\psi 0}$ term is substantially reduced by the DFT when $|\omega_p| > \omega_{Stop}$.

The $D_{\psi-1}(t)$ term is substantially reduced by the DFT when $|2\omega_D| > \omega_{Stop}$. The $D_{\psi B}(t)$ term is substantially reduced by the DFT when $|w_R + 2w_D| > w_{Stop}$. The $D_{\psi-1}$ and $D_{\psi B}$ frequency ranges are preferably sufficiently separated from each other that they may be considered separately.

FIG. 5B shows a schematic diagram of CEC error estimator 544. In the following discussions the product of two complex signals frequently occurs. The following identities are used:

$$(\cos(A)+j\sin(A)) \cdot (\cos(B)+j\sin(B)) = \cos(A+B) + j\sin(A+B), \quad (21)$$

$$(\cos(A)+j\sin(A)) \cdot (\cos(B)-j\sin(B)) = \cos(A-B) + j\sin(A-B), \quad (22)$$

$$(\cos(A)+j\sin(A))^* = \cos(A) - j\sin(A) = \cos(-A) + j\sin(-A) \quad (23)$$

The next step is the processing of signals for information about the cyclic error term $D_{\psi 0}$. The signal D(t) is sent to LPF (Lowpass Filter) 560, for example an IIR (Infinite Impulse Response) Butterworth digital filter, an FIR (Finite Impulse Response), or CIC (Cascaded Integrator Comb) digital filter as described by Hogenauer (*An Economical Class of Digital Filters for Decimation and Interpolation*; E. B. Hogenauer;

IEEE Transactions on Acoustics, Speech, and Signal Processing; Vol ASSP-29, No 2, April 1981, p 155-162, incorporated herein by reference). The CIC filter has the advantages in this implementation of simple design (using only integer addition) and decimation by large ratios. The implementation of an LPF for a complex signal uses two identical real LPF functions, one is used for the real component, and one is used for the imaginary component. The use of digital functions ensures precise matching of amplitude and phase response of the two filters.

For an LPF $T_n(x)$ of order n, the complex output $C_0$ is approximately:

$$C_0 = T_n[D(t)] = \quad (24)$$

$$\varepsilon_0(\cos(\zeta_0) - j\sin(\zeta_0)) + \left[A_1 O\left(\frac{\omega_c}{\omega_D}\right)^n + \varepsilon_{-1} O\left(\frac{\omega_c}{\omega_D}\right)^n + \varepsilon_B O\left(\frac{\omega_c}{\omega_B}\right)^n\right]$$

where $O(x)$ denotes a term of the order of x and $\omega_c$ is the $-3$ dB angular cutoff frequency.

The term on the right hand sides of Equation (24) with factor $A_1$ is the source of the largest error and accordingly determines the specifications of n and the minimum ratio for $\omega_D/\omega_c$ that can be used when the outputs of LPF 560 are stored in register 562. For a fourth order LPF, i.e., n=4, and a minimum ratio for $\omega_D/\omega_c=7$, the error terms on the right hand side of Equation (24) will generate errors that correspond to $\leq 0.010$ nm ($3\sigma$). When the stage is moving at a speed such that the corresponding Doppler shift frequency $|\omega_D/2\pi|$ is 10 to 100 times greater than the bandwidth of the stage servo control system and the requirement with respect to $\omega_D/\omega_c$ is satisfied, the output $C_0$ of the LPF 560 is stored in register 562 as $C_{0R}$ under the control of signal 561.

An advantage of this approach is that $\omega_D$, can vary by factors such as 2 or more during the period when output values of $C_0$ are stored in register 562.

The values for $C_{0R}$ and $D(t)$ are transmitted to processor 564 for the generation of complex signal $\Sigma_1(t)$ where $$\sum_1 (t) = D(t) - C_{0R} = A_1(\cos(\varphi + \zeta_1) - j\sin(\varphi + \zeta_1)) + \quad (25)$$

$$\varepsilon_{-1}(\cos(-\varphi + \zeta_{-1}) - j\sin(-\varphi + \zeta_{-1})) +$$

$$\varepsilon_B(\cos(-\varphi + \zeta_B) - j\sin(-\varphi + \zeta_B)).$$

Signal $\Sigma_1$ is sent to processor 568, which calculates $\Sigma_{-1}$ as the complex conjugate of $\Sigma_1$.

$$\sum_{-1} (t) = \sum_1 (t) \ast = A_1(\cos(-\varphi - \zeta_{-1}) - j\sin(-\varphi - \zeta_{-1})) + \varepsilon_{-1}( \quad (26)$$

$$\cos(\varphi - \zeta_{-1}) - j\sin(\varphi - \zeta_{-1})) + \varepsilon_B(\cos(\varphi - \zeta_B) - j\sin(\varphi - \zeta_B)).$$

Signal $\Sigma_1$ is sent to processor 580, which calculates $\Sigma_2$.

$$\sum_2 = (\sum_1)^2 = A_1^2(\cos(2\varphi + 2\zeta_1) - j\sin(2\varphi + 2\zeta_1)) + \quad (27)$$

$$2A_1\varepsilon_{-1}(\cos(\zeta_1 + \zeta_{-1}) - j\sin(\zeta_1 + \zeta_{-1})) +$$

$$2A_1\varepsilon_B(\cos(\zeta_1 + \zeta_B) - j\sin(\zeta_1 + \zeta_B)) + O(\varepsilon_i, \varepsilon_j).$$

Signal $\Sigma_2$ is divided by two (not shown) and sent to LPF 590, as described earlier for LPF 560.

For an LPF $T_n(x)$ of order n, the complex output $C_4$ may be simplified and expressed in two forms herein referred to as $C_{4N}$ and $C_{4B}$. In the frequency range where the $A_1\varepsilon_{-1}$ term is significant (and the $A_1\varepsilon_B$ term is insignificant):

$$C_{4N} = T_n\left[\frac{1}{2}\sum_2\right] = \quad (28a)$$

$$A_1\varepsilon_{-1}(\cos(\zeta_1 + \zeta_{-1}) - j\sin(\zeta_1 + \zeta_{-1})) + \left[\frac{1}{2}A_1^2 O\left(\frac{\omega_c}{\omega_{-1}}\right)^n\right]$$

or in the frequency range where the $A_1\varepsilon_B$ term is significant (and the $A_1\varepsilon_{-1}$ term is insignificant), $$\omega_B = |\omega_R + 2\omega_D| = |(\phi_R + 2d_\phi)/dt| \text{ and:}$$

$$C_{4B} = \quad (28b)$$

$$T_n\left[\frac{1}{2}\sum_2\right] = A_1\varepsilon_B(\cos(\zeta_1 + \zeta_B) - j\sin(\zeta_1 + \zeta_B)) + \left[\frac{1}{2}A_1^2 O\left(\frac{\omega_c}{\omega_B}\right)^n\right]$$

where $O(x)$ denotes a term of the order of x, and $\omega_c$ is the $-3$ dB angular cutoff frequency.

The term on the right hand sides of Equations (28a) and (28b) with factors $A_1^2$ are the source of the largest error and accordingly determines the specifications of n and the minimum ratios for $\omega_{-1}/w_c$ and $\omega_B/\omega_c$ that can be used when the outputs of processor 590 are stored in register 592. For a fourth order LPF, i.e., n=4, and a minimum ratio of 7, the error terms on the right hand side of Equations (28a) and (28b) will generate errors that correspond to 0.010 nm ($3\sigma$).

When the stage (on which the encoder scale is located) is moving at a speed such that the corresponding Doppler frequency $|w_{-1}/2\pi|$ is 10 to 100 times greater than the bandwidth of the stage servo control system and the requirement with respect to $\omega_{-1}/\omega_c$ is satisfied, the output $C_{4N}$ of LPF 590 represents the negative Doppler cyclic error, $$C_{4N} = A_1\varepsilon_{-1}(\cos(\zeta_1 + \zeta_{-1}) - j\sin(\zeta_1 + \zeta_{-1})),$$

which is stored in register 592 as $C_{4RN}$ under the control of signal 565.

When the stage is moving at a speed such that the corresponding aliased Doppler frequency $|\omega_B/2\pi|$ is 10 to 100 times greater than the bandwidth of the stage servo control system and the requirement with respect to $\omega_B/\omega_c$ is satisfied, the output $C_{4B}$ of LPF 590 represents the baseband Doppler cyclic error, $$C_{4B} = A_1\varepsilon_B(\cos(\zeta_1 + \zeta_B) - j\sin(\zeta_1 + \zeta_B)),$$

which is stored in register 594 as $C_{4RB}$ under the control of signal 566.

The magnitude squared of signal $D(t)$ is calculated by multiplier 552:

$$C_1(t) = D(t) \cdot D(t)^*. \quad (29)$$

This may be simplified and implemented as:

$$C_1(t) = Re(D(t))^2 + Im(D(t))^2. \quad (30)$$

Alternate methods to calculate a value equivalent to the result of equation (30) are possible, for example the magnitude output 525 from CORDIC converter 524 could be squared (and scaled if necessary), or signal $\Sigma_1$ could be used instead of $D(t)$.

When equation (30) is evaluated using the terms of D(t) from equations (16) to (20), the following result is obtained:

$$C_1(t) = A_1^2 + [\varepsilon_{-1}^2 + \varepsilon_0^2 + \varepsilon_B^2] + 2A_1\varepsilon_{-1}\cos(2\varphi + \zeta_1 - \zeta_{-1}) + \quad (31)$$
$$2A_1\varepsilon_0\cos(\varphi + \zeta_1 - \zeta_0) + 2A_1\varepsilon_B\cos(-\varphi + \zeta_1 - \zeta_B) + O(\varepsilon_i\varepsilon_j).$$

The signal $C_1(t)$ is sent to LPF (Lowpass Filter) 554 as described earlier for LPF 560.

For an LPF $T_n(x)$ of order n, the output $C_1$ is approximately:

$$C_1 = T_n[C_1(t)] = A_1^2 + [\varepsilon_{-1}^2 + \varepsilon_0^2 + \varepsilon_B^2] + \quad (32)$$
$$2A_1\left[\varepsilon_{-1}O\left(\frac{\omega_c}{\omega_{-1}}\right)^n + \varepsilon_0 O\left(\frac{\omega_c}{\omega_D}\right)^n + \varepsilon_B O\left(\frac{\omega_c}{\omega_B}\right)^n\right].$$

The accuracy required for the determination of $C_1$ is approximately 0.5% in order to limit errors generated in the computation of cyclic error signals $S_{\psi j}$ to 0.010 nm (3σ). Therefore the error terms $\varepsilon_{-1}^2$, $\varepsilon_0^2$, and $\varepsilon_B^2$ on the right hand side of Equation (32) are negligible. The terms on the right hand side of Equation (32) of the form $$O\left(\frac{\omega_c}{\omega_-}\right)^n$$

are the sources of the largest Doppler shift frequency dependent errors and accordingly determine the specifications of n and the minimum ratio for $\omega_{-1}/\omega_c$, $\omega_D/\omega_c$, and $\omega_B/\omega_c$ respectively that can be used when the output of LPF 554 is held in register 556, providing signal $C_{1R}$. For a second order LPF, i.e., n=2, and a minimum ratio of 3.5, the Doppler shift frequency dependent error terms on the right hand side of Equation (32) will generate errors that correspond to 0.010 nm (3σ). When the stage is moving at a speed such that the corresponding Doppler shift frequency $|\omega_D/2\pi|$ is 10 to 100 times greater than the bandwidth of the stage servo control system and the requirement with respect to $\omega_D/\omega_c$ is satisfied, the output $C_1$ of LPF 554 is stored in register 556 as $C_{1R}$ under the control of signal 561.

Processor 604 calculates compensating signal $D_\psi(t)$ as shown in FIG. 5C and Equation (33).

$$D\psi(t) = C_{0R} + \frac{C_{4R}}{C_{1R}}\sum_{-1} \quad (33)$$

Control signals 613 directs MUX 622 to select coefficients $C_{4RN}$ or $C_{4RB}$ for use as $C_{4R}$ as required for CE N or CE B compensation respectively. Divider 620, multiplier 630 and adder 640 implement the corresponding operations shown in equation (33). Control signals 611 and 612 enable use of the calculated compensating signals shown in Equation (33) when conditions indicate that a valid compensation signal is present. In this preferred embodiment, the hardware for calculating coefficient $C_4$ and the hardware for calculating the compensating signal based on $C_{4R}$ is shared for use in both CE N and CE B compensation. This embodiment also makes both $C_{4RN}$ and $C_{4RB}$ coefficients available for diagnostics.

Equation (33) can be expanded using the most significant terms from the previously expressed equations (24) (32), (28a), and (28b) for the $C_N$ terms, and equation (26) for the $\Sigma_N$ term to:

$$D\psi(t) = \varepsilon_0(\cos(\zeta_0) - j\sin(\zeta_0)) + \frac{A_1\varepsilon_{-1}(\cos(\zeta_1 + \zeta_{-1}) - j\sin(\zeta_1 + \zeta_{-1}))}{A_1^2} \quad (34)$$
$$A_1(\cos(-\varphi - \zeta_1) - j\sin(-\varphi - \zeta_1)) +$$
$$\left(\frac{A_1^2\varepsilon_B(\cos(\zeta_1 + \zeta_B) - j\sin(\zeta_1 + \zeta_B))}{A_1^2} *\right)$$
$$A_1(\cos(-\varphi - \zeta_1) - j\sin(-\varphi - \zeta_1))$$

and simplified to:

$$D\psi(t) = \quad (35).$$
$$\varepsilon_0(\cos(\zeta_0) - j\sin(\zeta_0)) + \varepsilon_{-1}(\cos(-\varphi + \zeta_{-1}) - j\sin(-\varphi + \zeta_{-1})) +$$
$$\varepsilon_B(\cos(-\varphi + \zeta_B) - j\sin(-\varphi + \zeta_B)).$$

Reverting to the nomenclature conventions that were changed immediately after equation (20), this becomes:

$$D\psi(t_1) = \varepsilon_0(\cos(\zeta_0) - j\sin(\zeta_0)) + \quad (36)$$
$$\varepsilon_{-1}(\cos(-\varphi(t_1) + \zeta_{-1}) - j\sin(-\varphi(t_1) + \zeta_{-1})) +$$
$$\varepsilon_B(\cos(-\varphi(t_1) + \zeta_B) - j\sin(-\varphi(t_1) + \zeta_B)).$$

Note that the calculated result in equation (36) is identical to $D_\psi(t)$ as described in equations (17) to (20).

Control signals 611, 612, and 613 are generated by control circuitry (not shown) that may consider the speed of motion, the signal level, the cyclic error level, the duration of motion, and possible other conditions to determine the validity or usefulness of $D_\psi(t)$. It may also be desirable to enable each of the cyclic error terms separately, for example if the $\varepsilon_B$ term was found to be insignificant for a specific implementation, the calculation could be disabled to eliminate noise contributed by the calculation. When a $D_\psi(t)$ term or output is disabled, zero is substituted. The calculated $D_\psi(t)$ is subtracted from signal D(t) by subtractor (adder) 546, resulting in a measurement signal with substantially reduced cyclic errors.

Using the CMS approach, other techniques can be incorporated to compensate for some of the sources of cyclic errors. For example, the dominant error term is typically the unshifted cyclic error component, $S_{\psi 0}$, or equivalently $D_{\psi 0}$, which stays at constant phase and frequency regardless of encoder scale motion. This term arises from the presence of both optical frequencies in either the reference arm or the measurement arm of the interferometric encoder system or both. This occurs, for example, if the optical frequencies of the light source are not perfectly separated into orthogonal linear polarization states.

The cyclic error compensation techniques described above can be applied to any two-frequency, interferometric encoder system in which the cyclic error term that does not experience Doppler shift is dominant. It is noted that, if desired, the accuracy of the cyclic error correction can further be improved to higher order in the amplitude of the cyclic error coefficients by iterating the compensation of the main signal S(t) or D(t). In other words, for each subsequent iteration, the compensated signal for the main signal is used to generate corresponding cyclic error basis functions and determine a higher order correction to each of the cyclic error coefficients.

Depending on the embodiment, the compensation technique described above can be implemented in hardware or software, or a combination of both. The technique can be implemented in computer programs using standard programming techniques following the method and figures described herein. Program code is applied to input data to perform the functions described herein and generate output information. The output information is applied to one or more output devices such as the servo control system.

Each program may be implemented in a high level procedural or object oriented programming language to communicate with a computer system, or the programs can be implemented in assembly or machine language, if desired. In any case, the language can be a compiled or interpreted language. Moreover, the program can run on dedicated integrated circuits preprogrammed for that purpose.

Each such computer program may be stored on a storage medium or device (e.g., ROM, magnetic diskette, FLASH drive, among others) readable by a general or special purpose programmable computer, for configuring and operating the computer when the storage media or device is read by the computer to perform the procedures described herein. The computer program can also reside in cache or main memory during program execution. The compensation technique can also be implemented as a computer-readable storage medium, configured with a computer program, where the storage medium so configured causes a computer to operate in a specific and predefined manner to perform the functions described herein.

Figure 6A:
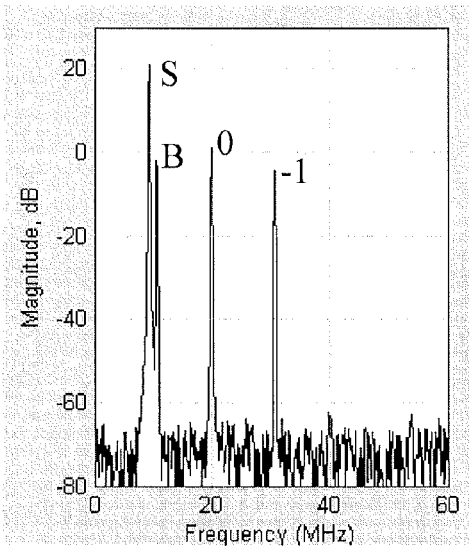
FIGS. 6A-6D are graphs of exemplary simulations of cyclic error correction applied to a heterodyne interference signal.

FIGS. 6A-6D are graphs illustrating results of an exemplary simulation of the DFT processing and CEC math described above as applied to a heterodyne interference signal. The simulation was performed using MATLAB® and Simulink® modeling software available from The Mathworks Inc. FIG. 6A shows an input signal spectrum that includes the Doppler shifted measurement signal (S) and the CE B (B), CE 0 (0), and CE−1 (−1) cyclic error signals. The input signal spectrum represents a simulated signal in this example using the MATLAB® software. In this example, the Doppler shifted input measurement signal frequency $f_s$ is near the baseband Doppler cyclic error signal frequency $f_B$ so a cyclic error will appear in the position values obtained by the interferometer. The amplitude ratio of the CE B cyclic error to the input measurement signal is 7% (−23 dB); the amplitude ratio of the CE 0 cyclic error to the input measurement signal is 10% (−20 dB); and the amplitude ratio of the CE N cyclic error to the input measurement signal is 5% (−26 dB).

As the difference between $f_s$ and $f_B$ increases, the effect of the cyclic error is reduced by the filtering action of the DFT and the digital filter.

Figure 6B:
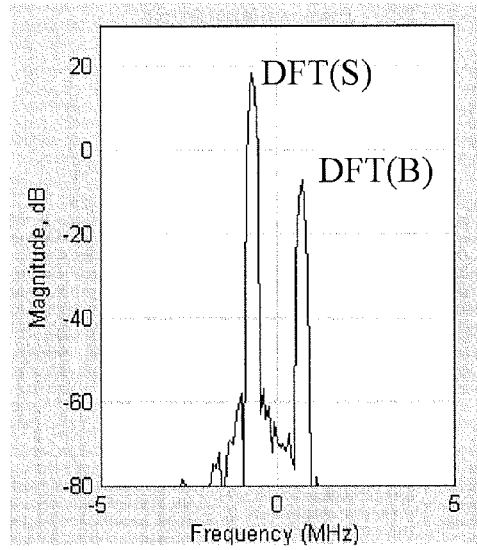

FIG. 6B shows the complex spectrum of the output from the DFT. The CE 0 and the CE N signals are eliminated by the filtering action of the DFT. The measurement signal (DFT(S)) and the CE B signal (DFT(B)) are now represented by complex values with bipolar spectrums. The frequencies now appear near zero due to aliasing.

Figure 6C:
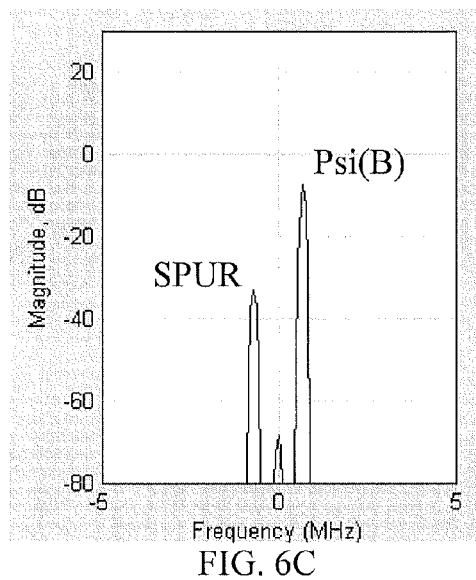

FIG. 6C shows the complex spectrum of the cyclic error compensation signal (Psi(B)). There is also a spurious signal (SPUR) at the same frequency as the measurement signal. This creates a residual cyclic error at a much lower level than the original cyclic error.

Figure 6D:
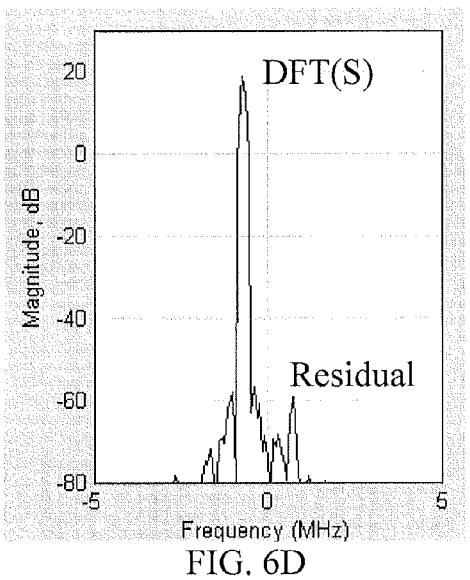

FIG. 6D shows the complex spectrum of the compensated measurement signal. The amplitude of the cyclic error is greatly reduced in this example by 80 dB. The spurious compensation signal is not visible in this spectrum, since it is the same frequency as the measurement signal.

In further embodiments, the interferometry system may be different than that shown in FIG. 1. In particular, the cyclic error compensation technique is applicable to other types of interferometers as well. For example, the main interference signal S(t) may be produced by an interferometry system that may include any of single and/or multiple pass interferometers, passive interferometers, dynamic interferometers, and dispersion interferometers. Furthermore, the interferometry system may monitor one or more degrees of freedom, each of which may produce a corresponding main interference signal S(t), which may be compensated for cyclic errors as disclosed herein. Furthermore, the degree(s) of freedom monitored by the interferometry system may include any of changes in distance to a measurement object, changes in relative distance between two measurement objects, changes in the angular orientation of a measurement object, and changes in the direction of the input beam.

Lithography Systems

Because of the cyclic error compensation, the interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the displacement measuring interferometers and interferometric encoder systems used to position the wafer and reticle (or mask) stages. Since a lithography tool may produce $50-100M/year of product, the economic value from improved performance displacement measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometric encoder systems described above can be used to precisely measure the positions of each of the wafer stage and mask stage relative to other components of the exposure system, such as the lens assembly, radiation source, or support structure. In such cases, the interferometry system can be attached to a stationary structure and the measurement object having the encoder scale attached to a movable element such as one of the mask and wafer stages. Alternatively, the situation can be reversed, with the interferometry system attached to a movable object and the measurement object having the encoder scale attached to a stationary object.

More generally, such interferometry systems can be used to measure the position of any one component of the exposure system relative to any other component of the exposure system, in which the interferometry system is attached to, or supported by, one of the components and the measurement object having the encoder scale is attached, or is supported by the other of the components.

Figure 7:
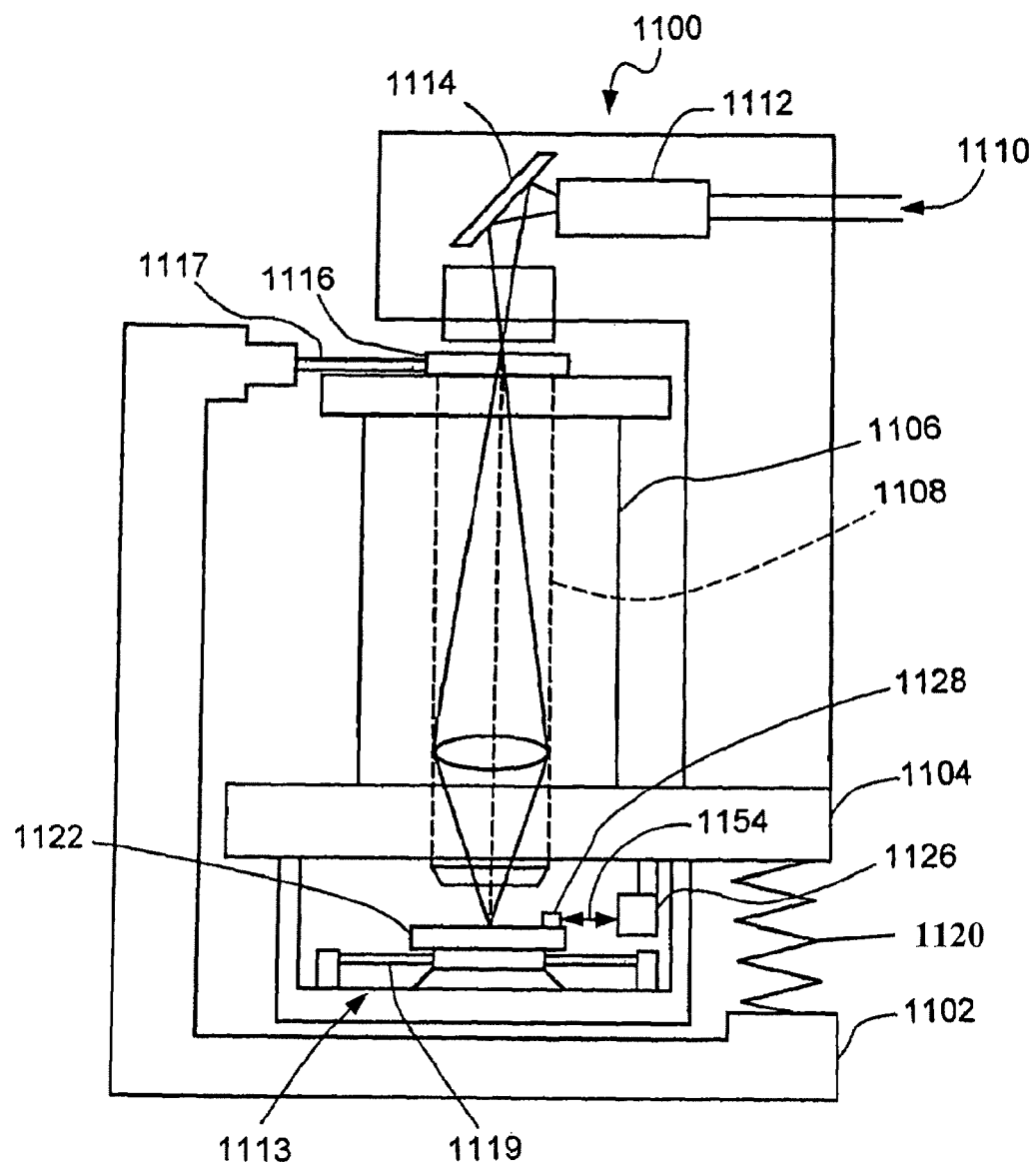
FIG. 7 is a schematic diagram of an exemplary lithography tool that includes an interferometer.

An example of a lithography scanner 1100 using an interferometry system 1126 is shown in FIG. 7. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes an encoder scale 1128 for diffracting a primary beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The primary beam is incident on encoder scale at an incident angle such that the diffracted measurement beam does not satisfy the Littorw condition. One or more optical elements (not shown) then can be used to direct the diffracted measurement beam back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 derives a reference beam (not shown) from the primary beam. In some embodiments, the reference beam is derived from a source separate from the primary beam. One or more optical components (not shown) within the interferometry system 1126 combine the reference beam with the diffracted measurement beam to produce an output beam. The interference signal produced by interferometry system 1126 when combining measurement beam 1154 diffracted from encoder scale 1128 and the reference beam indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 8A:
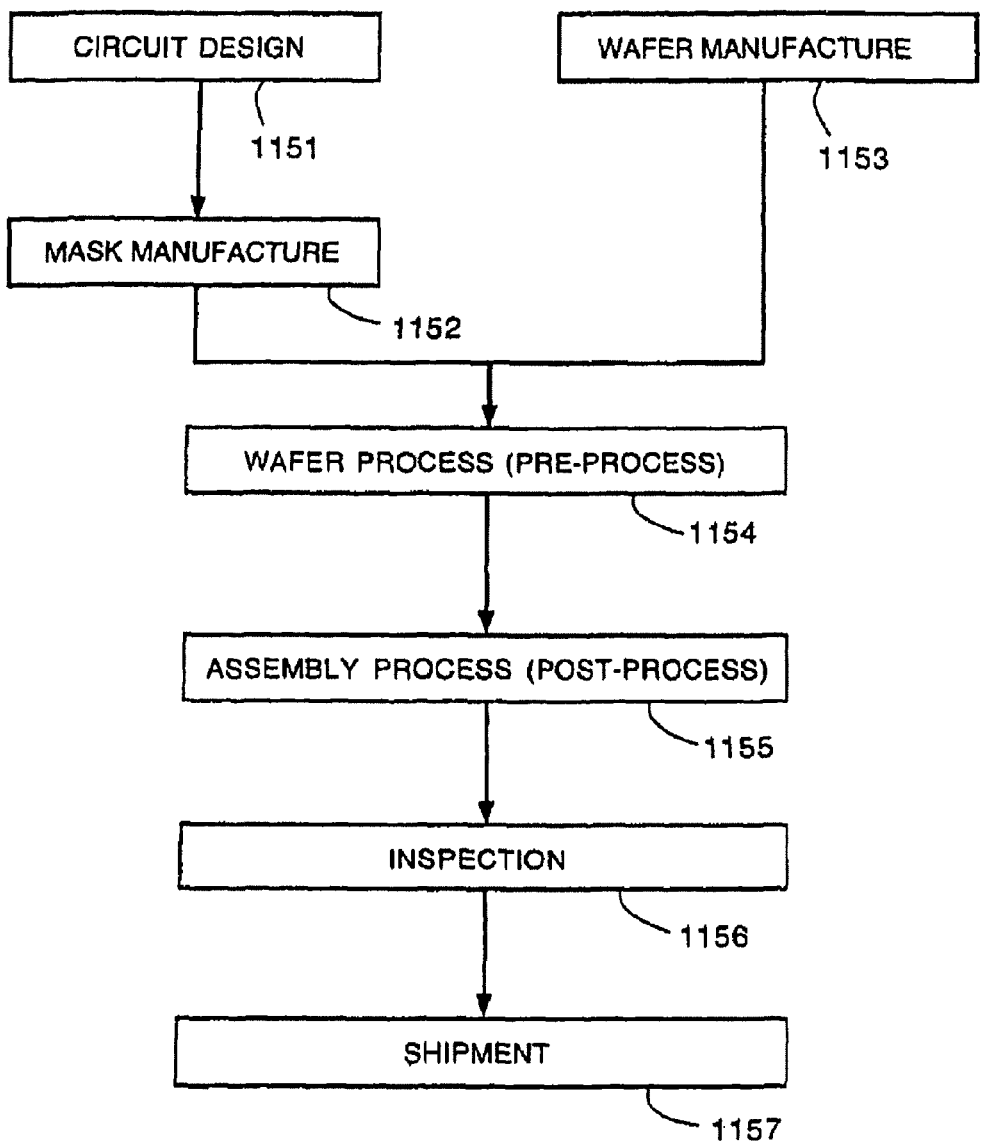
FIGS. 8A and 8B are flow charts that describe steps for making integrated circuits.
Figure 8B:
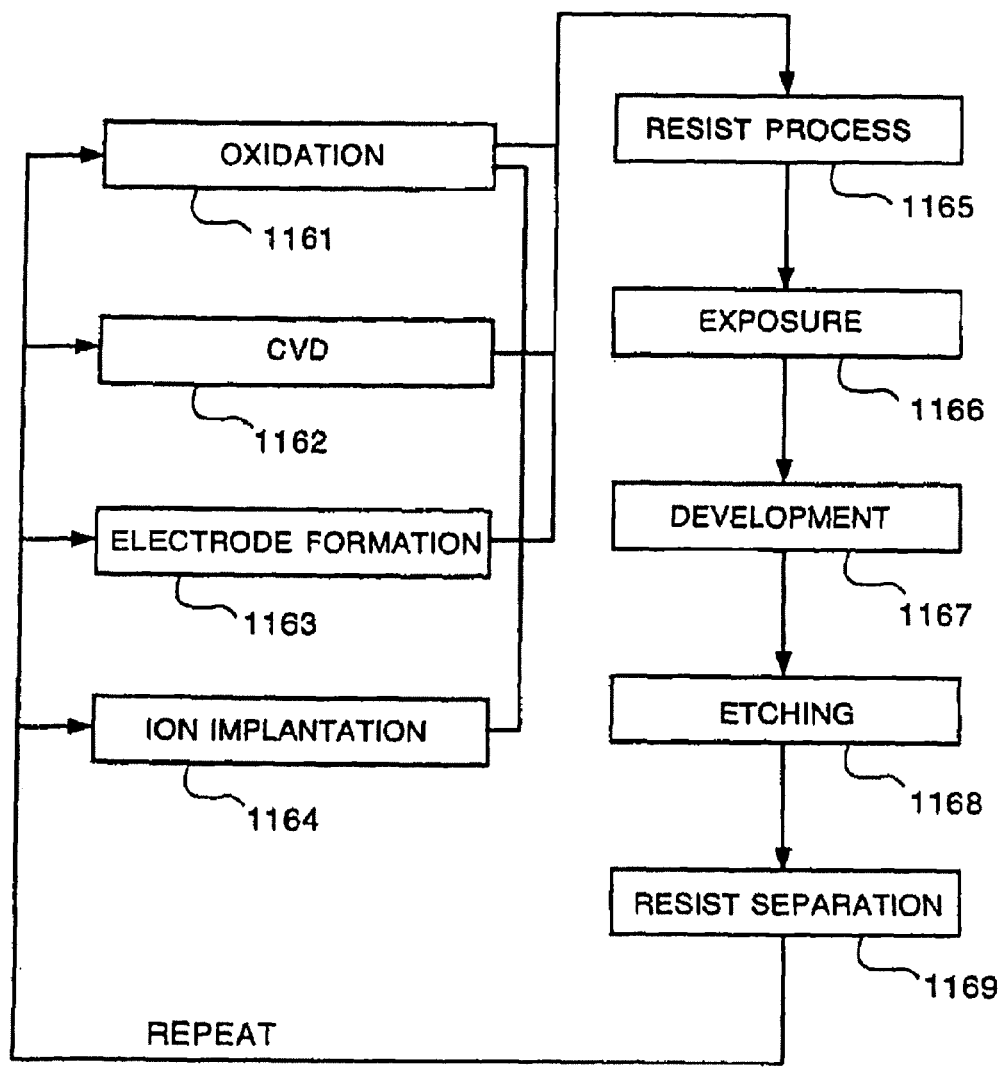

As is well known in the art, lithography is a critical part of manufacturing methods for making semiconducting devices. For example, U.S. Pat. No. 5,483,343 outlines steps for such manufacturing methods. These steps are described below with reference to FIGS. 8(a) and 8(b). FIG. 8(a) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

FIG. 8(*b*) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 9:
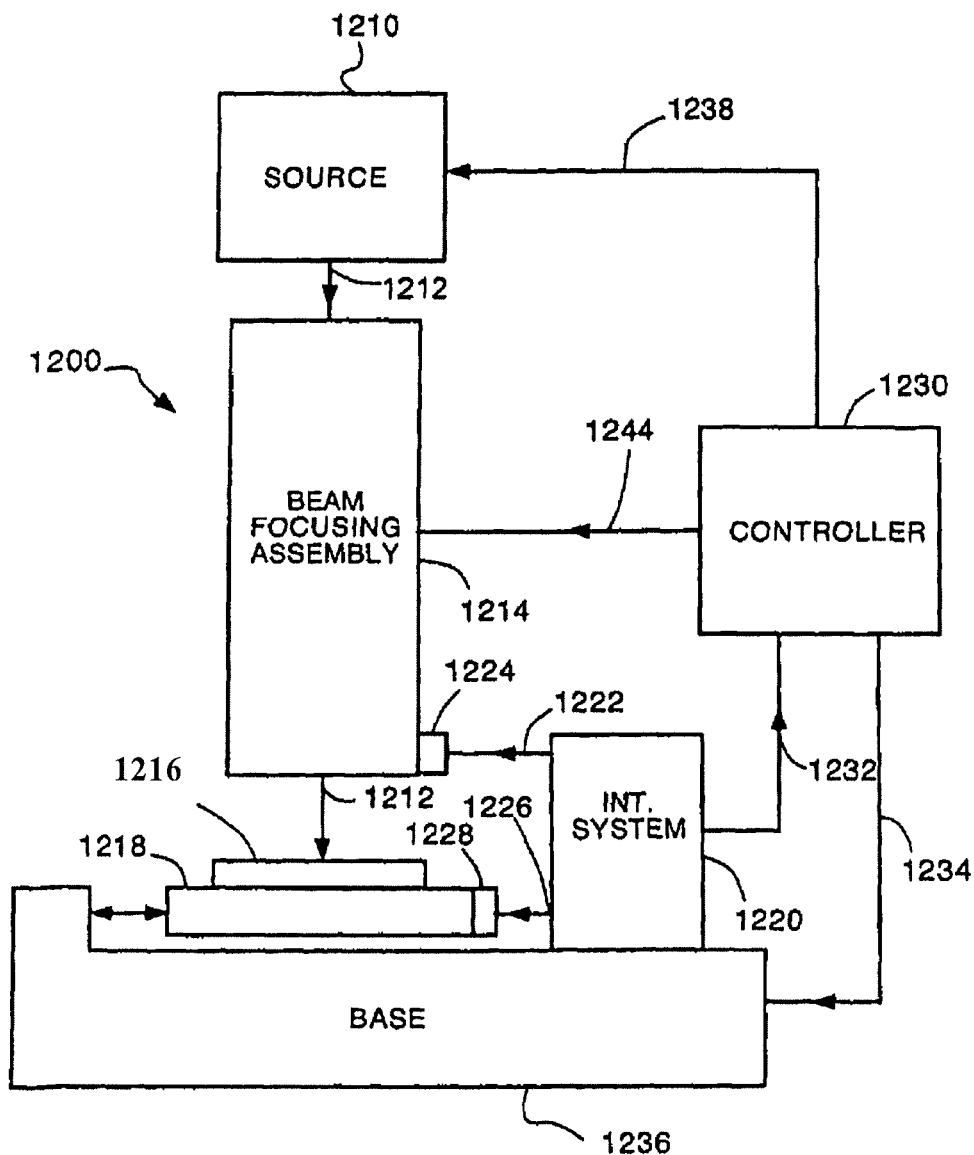
FIG. 9 is a schematic of an exemplary beam writing system that includes an interferometry system.

As an example, a schematic of a beam writing system 1200 is shown in FIG. 9. A source 1210 generates a write beam 1212, and a beam focusing assembly 1214 directs the radiation beam to a substrate 126 supported by a movable stage 1218. To determine the relative position of the stage, an interferometry system 1220 directs a reference beam 1222 to a mirror or encoder scale 1224 mounted on beam focusing assembly 1214 and a measurement beam 1226 to a mirror or encoder scale 1228 mounted on stage 1218. Since the reference beam contacts a mirror or encoder scale mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments have been described. Other embodiments are within the scope of the following claims.

What is claimed is:

1. A method comprising:
obtaining, from an interferometer, a time-varying interference signal S(t) based on a combination of a first beam and a second beam, subsequent to the first beam being diffracted from an encoder scale, wherein at least one of the encoder scale and the interferometer is moveable with respect to the other;
obtaining one or more error correction signals based on one or more errors that modify the time-varying interference signal S(t), wherein the one or more error correction signals comprises an error correction signal representative of a baseband Doppler error; and
outputting information about a change in a position of the encoder scale relative to the interferometer based on the time-varying interference signal S(t) and the one or more error correction signals.

2. The method of claim 1, wherein the one or more errors cause the time-varying interference signal S(t) to deviate from an ideal expression of the form $A_1 \cos(\Phi_R(t)+\Phi(t)+\zeta_1)$, where $A_1$ and $\zeta_1$ are constants, $\Phi_R(t)$ is a time-varying reference phase equal to $\omega_R t$ where $\omega_R$ is an angular frequency difference between the first beam and the second beam, and $\Phi(t)$ is a phase difference indicative of an optical path difference between the first beam and the second beam.

3. The method of claim 2, further comprising measuring $\Phi_R(t)$ from a reference beam derived from a first portion of an input beam, wherein the first beam and the second beam are derived from a second portion of the input beam.

4. The method of claim 2, wherein the baseband Doppler error is independent of the reference phase $\Phi_R(t)$.

5. The method of claim 1, further comprising applying a frequency transform to the time-varying interference signal S(t) to generate a complex measurement signal.

6. The method of claim 5, wherein applying the frequency transform comprises applying a Discrete Fourier Transform (DFT) to the time-varying interference signal S(t).

7. The method of claim 5, further comprising applying a window function to the time-varying interference signal S(t) prior to applying the DFT.

8. The method of claim 6, wherein the DFT is folded.

9. The method of claim 5, wherein applying the frequency transform to the time-varying interference signal S(t) comprises digitizing the time-varying interference signal S(t) to produce a digitized measurement signal.

10. The method of claim 9, wherein applying the frequency transform to the time-varying interference signal S(t) further comprises converting a series of consecutive samples of the digitized measurement signal into the complex measurement signal.

11. The method of claim 5, further comprising compensating the complex measurement signal based on the one or more error correction signals to provide the information about the change in the position of the encoder scale relative to the interferometer.

12. The method of claim 11, wherein compensating the complex measurement signal comprises subtracting the one or more error correction signals from the complex measurement signal.

13. The method of claim 11, wherein obtaining one or more error correction signals comprises:
obtaining one or more error basis functions representative of the one or more errors;
obtaining one or more factors relating to at least one of amplitude or offset phase of one or more cyclic error terms; and
generating the one or more error correction signals based on the one or more error basis functions and the one or more factors.

14. The method of claim 13, wherein the one or more factors are complex factors.

15. The method of claim 13, wherein obtaining the one or more factors is based on values from the complex measurement signal.

16. The method of claim 1, wherein the one or more error correction signals comprises an error correction signal representative of a negative Doppler error.

17. The method of claim 1, wherein the one or more error correction signals comprises an error correction signal representative of a zero Doppler error.

18. The method of claim 1, wherein outputting the information about the change in the position of the encoder scale relative to the interferometer comprises reducing contributions from the one or more errors based on the one or more correction signals to produce a corrected time-varying interference signal.

19. The method of claim 18, wherein outputting the information about the change in the position of the encoder scale relative to the interferometer further comprises determining information indicative of an optical path difference between the first beam and the second beam from the corrected time-varying interference signal.

20. The method of claim 1, wherein the first beam is a non-zero diffracted order of a primary beam impinging on the encoder scale, the first beam being non-co-linear with the primary beam at the encoder scale.

21. The method of claim 1, wherein the first beam and the second beam are derived from a common source.

22. The method of claim 21, wherein the common source is configured to introduce an angular frequency difference between the first beam and the second beam.

23. The method of claim 1, wherein the first beam and the second beam are orthogonally polarized with respect to one another.

24. The method of claim 1, wherein the encoder scale comprises a grating.

25. The method of claim 24, wherein the grating comprises a one-dimensional grating.

26. The method of claim 24, wherein the grating comprises a two-dimensional grating.

27. The method of claim 1, wherein the first beam is Doppler shifted subsequent to being diffracted by the encoder scale, and wherein the baseband Doppler error comprises an error caused by interference of the Doppler shifted first beam and a non-Doppler shifted portion of the first beam.

28. The method of claim 1, wherein a portion of the second beam is Doppler shifted by the encoder scale, and wherein the baseband Doppler error comprises an error caused by interference of the Doppler shifted portion of the second beam and a non-Doppler shifted portion of the second beam.

29. An apparatus comprising:
an interferometry system configured to, during operation of the apparatus, combine a first beam diffracted from an encoder scale and a second beam to produce an output beam corresponding to a time-varying interference signal S(t),
wherein at least one of the encoder scale and the interferometry system is moveable with respect to the other, and imperfections in the interferometry system produce one or more errors that modify the time-varying interference signal S(t); and
an electronic processor configured to, during operation of the apparatus, perform operations comprising:
obtaining one or more error correction signals based on the one or more errors, wherein the one or more error correction signals comprises an error correction signal representative of a baseband Doppler error; and
outputting information about a change in a position of the encoder scale relative to the interferometry system based on the time-varying interference signal S(t) and the one or more error correction signals.

30. The apparatus of claim 29, wherein the one or more errors cause the time-varying interference signal S(t) to deviate from an ideal expression of the form $A_1 \cos(\Phi_R(t)+\Phi(t)+\zeta_1)$, where $A_1$ and $\zeta_1$ are constants, $\Phi_R(t)$ is a time-varying reference phase equal to $\omega_R t$ where $\omega_R$ is an angular frequency difference between the first beam and the second beam, and $\Phi(t)$ is a phase difference indicative of an optical path difference between the first beam and the second beam.

31. The apparatus of claim 30, wherein the interferometry system is further configured to, during operation of the apparatus:
provide an input beam;
derive a reference beam from a first portion of the input beam;
measure $\Phi_R(t)$ from the reference beam; and
derive the first beam and the second beam from a second portion of the input beam.

32. The apparatus of claim 30, wherein the baseband Doppler error is independent of the reference beam phase $\Phi_R(t)$.

33. The apparatus of claim 29, wherein the electronic processor is further configured to perform operations comprising applying a frequency transform to the time-varying interference signal S(t) to generate a complex measurement signal.

34. The apparatus of claim 33, wherein applying the frequency transform comprises applying a Discrete Fourier Transform (DFT) to the time-varying interference signal S(t).

35. The apparatus of claim 34, wherein applying the frequency transform comprises applying a window function to the time-varying interference signal S(t) prior to applying the DFT.

36. The apparatus of claim 34, wherein the DFT is folded.

37. The apparatus of claim 33, wherein applying the frequency transform to the time-varying interference signal S(t) comprises digitizing the time-varying interference signal S(t) to produce a digitized measurement signal.

38. The apparatus of claim 37, wherein applying the frequency transform to the time-varying interference signal S(t) further comprises converting a series of consecutive samples of the digitized measurement signal into the complex measurement signal.

39. The apparatus of claim 29, wherein the electronic processor is further operable to perform operations comprising compensating the complex measurement signal based on the one or more error correction signals to provide the information about the change in the position of the encoder scale relative to the interferometer.

40. The apparatus of claim 39, wherein compensating the complex measurement signal comprises subtracting the one or more error correction signals from the complex measurement signal.

41. The apparatus of claim 39, wherein obtaining one or more error correction signals comprises:
obtaining one or more error basis functions representative of the one or more errors;
obtaining one or more factors relating to at least one of amplitude or offset phase of one or more cyclic error terms; and
generating the one or more error correction signals based on the one or more error basis functions and the one or more factors.

42. The apparatus of claim 41, wherein the one or more factors are complex factors.

43. The apparatus of claim 41, wherein obtaining the one or more factors is based on values from the complex measurement signal.

44. The apparatus of claim 29, wherein the one or more error correction signals comprises an error correction signal representative of a negative Doppler error.

45. The apparatus of claim 29, wherein the one or more error correction signals comprises an error correction signal representative of a zero Doppler error.

46. The apparatus of claim 29, wherein outputting the information about the change in the position of the encoder scale relative to the interferometer comprises reducing contributions from the one or more errors based on the one or more correction signals to produce a corrected time-varying interference signal.

47. The apparatus of claim 46, wherein outputting the information about the change in the position of the encoder scale relative to the interferometer further comprises determining information indicative of an optical path difference between the first beam and the second beam from the corrected time-varying interference signal.

48. The apparatus of claim 29, further comprising the encoder scale.

49. The apparatus of claim 48, wherein the encoder scale is a grating.

50. The apparatus of claim 49, wherein the grating is a one-dimensional grating.

51. The apparatus of claim 49, wherein the grating is a two-dimensional grating.

52. The apparatus of claim 29, further comprising a light source configured to provide an input beam comprising a first component and a second component, the first component and the second components having different angular frequencies and orthogonal polarization states.

53. The apparatus of claim 52, further comprising one or more first components arranged to:
derive a primary beam from the input beam; and
direct the primary beam toward the encoder scale.

54. The apparatus of claim 53, wherein the one or more first components comprises a first polarizing beam splitter arranged to derive the primary beam and the second beam from the input beam.

55. The apparatus of claim 54, further comprising one or more second components arranged to:
receive the first beam diffracted from the encoder scale; and
combine the first beam with the second beam.

56. The apparatus of claim 55, wherein the one or more second components comprises a polarizing beam combiner arranged to combine the first beam with the second beam to form the output beam.

57. The apparatus of claim 29, further comprising a detector to detect the output beam.

58. A computer program product, encoded on a non-transitory computer-readable medium, operable to cause a data processing apparatus to perform operations comprising:
obtaining, from an interferometer, a time-varying interference signal S(t) based on a combination of a first beam and a second beam, the first beam being diffracted from an encoder scale, wherein at least one of the encoder scale and the interferometer is moveable with respect to the other;
obtaining one or more error correction signals based on one or more errors that modify the time-varying interference signal S(t), wherein the one or more error correction signals comprises an error correction signal representative of a baseband Doppler error; and
outputting information about a change in a position of the encoder scale relative to the interferometer based on the time-varying interference signal S(t) and the one or more error correction signals.

59. A lithography system comprising:
a moveable stage for supporting a wafer, wherein the moveable stage comprises an encoder scale that moves with the moveable stage;
an illumination system configured to image radiation onto the wafer during operation of the lithography system;
a positioning system configured to adjust a position of the moveable stage during operation of the lithography system;
an interferometry system configured to, during operation of the lithography system:
direct a primary beam toward the encoder scale; and
combine a first beam diffracted from the encoder scale and a second beam to produce an output beam corresponding to a time-varying interference signal S(t),
wherein imperfections in the interferometry system produce one or more errors that modify the time-varying interference signal S(t); and
an electronic processor configured to, during operation of the lithography system, perform operations comprising:
obtaining one or more error correction signals based on the one or more errors, wherein the one or more error correction signals comprises an error correction signal representative of a baseband Doppler error; and
outputting information about a change in a position of the encoder scale relative to the interferometry system based on the time-varying interference signal S(t) and the one or more error correction signals.

* * * * *

UNITED STATES PATENT AND TRADEMARK OFFICE
CERTIFICATE OF CORRECTION

Page 1 of 1

PATENT NO. : 8,913,226 B2
APPLICATION NO. : 13/315957
DATED : December 16, 2014
INVENTOR(S) : Frank C. Demarest It is certified that error appears in the above-identified patent and that said Letters Patent is hereby corrected as shown below:

ON THE TITLE PAGE

Page 1

Item [73] (Assignee), delete "Corpporation," and insert -- Corporation, --

IN THE CLAIMS

Column 28

Line 50, in Claim 2, delete "$A_1 \cos(\Phi_R(t) + \Phi(t) + \zeta_1)$" and insert -- $A_1\cos(\Phi_R(t) + \Phi(t) + \zeta_1)$ --

Column 30

Lines 40-41, in Claim 30, delete "$A_1 \cos(\Phi_R(t) + \Phi(t) + \zeta_1)$" and insert -- $A_1\cos(\Phi_R(t) + \Phi(t) + \zeta_1)$ --

Signed and Sealed this
Seventh Day of April, 2015

Michelle K. Lee
*Director of the United States Patent and Trademark Office*